US010388395B2

(12) United States Patent
Lee et al.

(10) Patent No.: US 10,388,395 B2
(45) Date of Patent: Aug. 20, 2019

(54) STORAGE DEVICE AND BAD BLOCK ASSIGNING METHOD THEREOF

(71) Applicant: SAMSUNG ELECTRONICS CO., LTD., Suwon-si, Gyeonggi-Do (KR)

(72) Inventors: Kyungduk Lee, Incheon (KR); Young-Seop Shim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 28 days.

(21) Appl. No.: 15/837,841

(22) Filed: Dec. 11, 2017

(65) Prior Publication Data

US 2018/0286492 A1 Oct. 4, 2018

(30) Foreign Application Priority Data

Mar. 29, 2017 (KR) .................. 10-2017-0040197

(51) Int. Cl.
*G11C 29/44* (2006.01)
*G11C 29/38* (2006.01)
*G11C 29/00* (2006.01)

(52) U.S. Cl.
CPC .............. *G11C 29/44* (2013.01); *G11C 29/38* (2013.01); *G11C 29/789* (2013.01)

(58) Field of Classification Search
CPC ................................................. G11C 29/44
See application file for complete search history.

(56) References Cited

U.S. PATENT DOCUMENTS

| | | | |
|---|---|---|---|
| 7,038,949 B2 | 5/2006 | Chae et al. | |
| 7,679,133 B2 | 3/2010 | Son et al. | |
| 8,218,366 B2 | 7/2012 | Dong et al. | |
| 8,400,854 B2 | 3/2013 | Pei et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,760,918 B2 | 6/2014 | Lee et al. | |
| 9,064,545 B2 | 6/2015 | Cho et al. | |
| 9,104,580 B1 | 8/2015 | Meir | |
| 9,378,832 B1 | 6/2016 | Lu et al. | |
| 9,437,321 B2 | 9/2016 | Tseng et al. | |
| 2006/0291301 A1* | 12/2006 | Ziegelmayer | G11C 16/10 365/191 |
| 2010/0017650 A1 | 1/2010 | Chin et al. | |
| 2010/0306579 A1* | 12/2010 | Baek | G11C 29/4401 714/6.12 |
| 2011/0233648 A1 | 9/2011 | Seol et al. | |

(Continued)

*Primary Examiner* — Joseph D Torres
(74) *Attorney, Agent, or Firm* — Volentine, Whitt & Francos, PLLC

(57) ABSTRACT

A storage device includes a nonvolatile memory device that detects loop counts of state pass loops of at least one target state of a plurality of target states, and generates state loop count information (SLCI) indicative of whether a program operation is successful based on the detected loop count of the state pass loops, during a program operation of selected memory cells; and a storage controller that makes a request to the nonvolatile memory device for the state loop count information in response to detection of an operation condition or an external command, and assigns a memory block in which the selected memory cells are included as a bad block based on the state loop count information from the nonvolatile memory device.

20 Claims, 16 Drawing Sheets

(56) References Cited

U.S. PATENT DOCUMENTS

| | | |
|---|---|---|
| 2012/0008390 A1* | 1/2012 | Seong ................ G11C 11/5628 |
| | | 365/185.03 |
| 2012/0020166 A1 | 6/2012 | Ishii |
| 2013/0094294 A1* | 4/2013 | Kwak ................ H01L 27/1157 |
| | | 365/185.03 |
| 2014/0006688 A1* | 1/2014 | Yu .......................... G11C 16/10 |
| | | 711/103 |
| 2016/0147452 A1* | 5/2016 | Bae ...................... G11C 29/023 |
| | | 711/103 |
| 2016/0148695 A1 | 5/2016 | Kim |
| 2016/0148699 A1 | 5/2016 | Park |
| 2016/0148700 A1 | 5/2016 | Oh |
| 2016/0293259 A1 | 10/2016 | Kim |

* cited by examiner

FIG. 10

| Target State | Verify Loop | | State Loop Count Information(SLCI) | | | | | |
|---|---|---|---|---|---|---|---|---|
| | | | SPL Ref. | | | DL Ref. | | Loop Status |
| | Pass | Delta | SPL Min | SPL Max | | Delta Min | Delta Max | |
| P1 | 7 | - | 6 | 8 | | - | - | Pass |
| P2 | 10 | 3 | 9 | 11 | | 2 | 4 | Pass |
| P3 | 13 | 3 | 12 | 14 | | 2 | 4 | Pass |
| P4 | 16 | 3 | 15 | 17 | | 2 | 4 | Pass |
| P5 | 19 | 3 | 18 | 20 | | 2 | 4 | Pass |
| P6 | 22 | 3 | 21 | 23 | | 2 | 4 | Pass |
| P7 | 25 | 3 | 24 | - | | 2 | 4 | Pass |
| Loop Status Decision | | | | | | | | Pass |

STORAGE DEVICE AND BAD BLOCK ASSIGNING METHOD THEREOF

CROSS-REFERENCE TO RELATED APPLICATIONS

A claim for priority under 35 U.S.C. § 119 is made to Korean Patent Application No. 10-2017-0040197 filed Mar. 29, 2017, in the Korean Intellectual Property Office, the disclosure of which is hereby incorporated in its entirety by reference.

BACKGROUND

The inventive concepts described herein relate to a semiconductor memory device, and more particularly, to a storage device using loop status information and a bad block assigning method thereof.

Semiconductor memory devices may be classified as volatile semiconductor memory devices and as nonvolatile semiconductor memory devices. Volatile semiconductor memory devices have fast read and write speeds, but however lose data stored therein in absence of power supply. In contrast, nonvolatile semiconductor memory devices retain stored data in absence of power supply. For this reason, nonvolatile semiconductor memory devices are typically used to store information that has to be retained regardless of whether power is supplied.

Nonvolatile semiconductor memory devices typically include flash memory devices. Flash memory devices are used as voice and image data storage mediums of information devices such as computers, cellular phones, smartphones, personal digital assistants (PDAs), digital cameras, camcorders, voice recorders, MP3 players, handheld PCs, game consoles, facsimiles, scanners, and printers. Currently, high-capacity, high-speed, and low-power nonvolatile memory devices are being developed and mounted in mobile devices such as smartphones for example.

An operation of programming data in a nonvolatile memory device includes an operation of writing data in a selected memory area, and a status detecting operation of determining whether the writing of the data in the selected memory area has been performed normally. If the result of the status detecting operation indicates that the writing of the data in the selected memory area has been performed abnormally, the nonvolatile memory device determines the writing as having a program fail status. A memory area (or block) determined as having a program fail status is processed as a defective block or a bad block.

The status detecting operation includes determining whether the data are programmed within the limited number of program loops. However, the status detecting operation is limited, and can not prevent uncorrectable errors in a nonvolatile memory device in which memory cells are programmed to a plurality of target states. Integrity of data of nonvolatile memory devices may be markedly improved by detecting in advance an error that is difficult to check through the status detecting operation and assigning a block including the error as a run time bad block.

SUMMARY

Embodiments of the inventive concept provide a storage device capable of improve integrity of data by detecting the number of state pass loops of each target state, and assigning a bad block by using the detection result before an uncorrectable error occurs, and a bad block assigning method thereof.

Embodiments of the inventive concepts provide a storage device including a nonvolatile memory device configured to detect loop counts of state pass loops of at least one target state of a plurality of target states, and generate state loop count information (SLCI) indicative of whether a program operation is successful based on the detected loop count of the state pass loops, during the program operation of selected memory cells; and a storage controller configured to make a request to the nonvolatile memory device for the state loop count information in response to detection of an operation condition or an external command, and assign a memory block in which the selected memory cells are included as a bad block based on the state loop count information from the nonvolatile memory device.

Embodiments of the inventive concept provide a bad block assignment method of a storage device, the storage device including a nonvolatile memory device and a storage controller. The method includes monitoring, by the storage controller, an operation condition for performing a run time bad block processing operation; making, by the storage controller, a request to the nonvolatile memory device for state loop count information of a selected memory block of the nonvolatile memory device based on a result of the monitoring result; and assigning, by the storage controller, the selected memory block as a bad block with reference to the state loop count information from the nonvolatile memory device. The state loop count information is information indicative of a pass state or a fail state of a program operation, and the nonvolatile memory device determines the state loop count information based on a result of detecting loop counts of the state pass loops of each of a plurality of target states of the memory cells of the selected memory block upon programming the selected memory block.

Embodiments of the inventive concepts further provide a storage device including a nonvolatile memory device configured to store data in a plurality of memory; and a storage controller configured to detect an operation condition of the nonvolatile memory device, request state loop count information from the nonvolatile memory device based on the detected operation condition, receive the state loop count information from the nonvolatile memory device, and assign a selected memory block from among the plurality of memory blocks as a bad block based on the state loop count information. The state loop count information comprises loop counts of state pass loops of a plurality of target states of memory cells within the selected memory block.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 10 illustrates a table including state loop count information;

DETAILED DESCRIPTION

Figure 1:
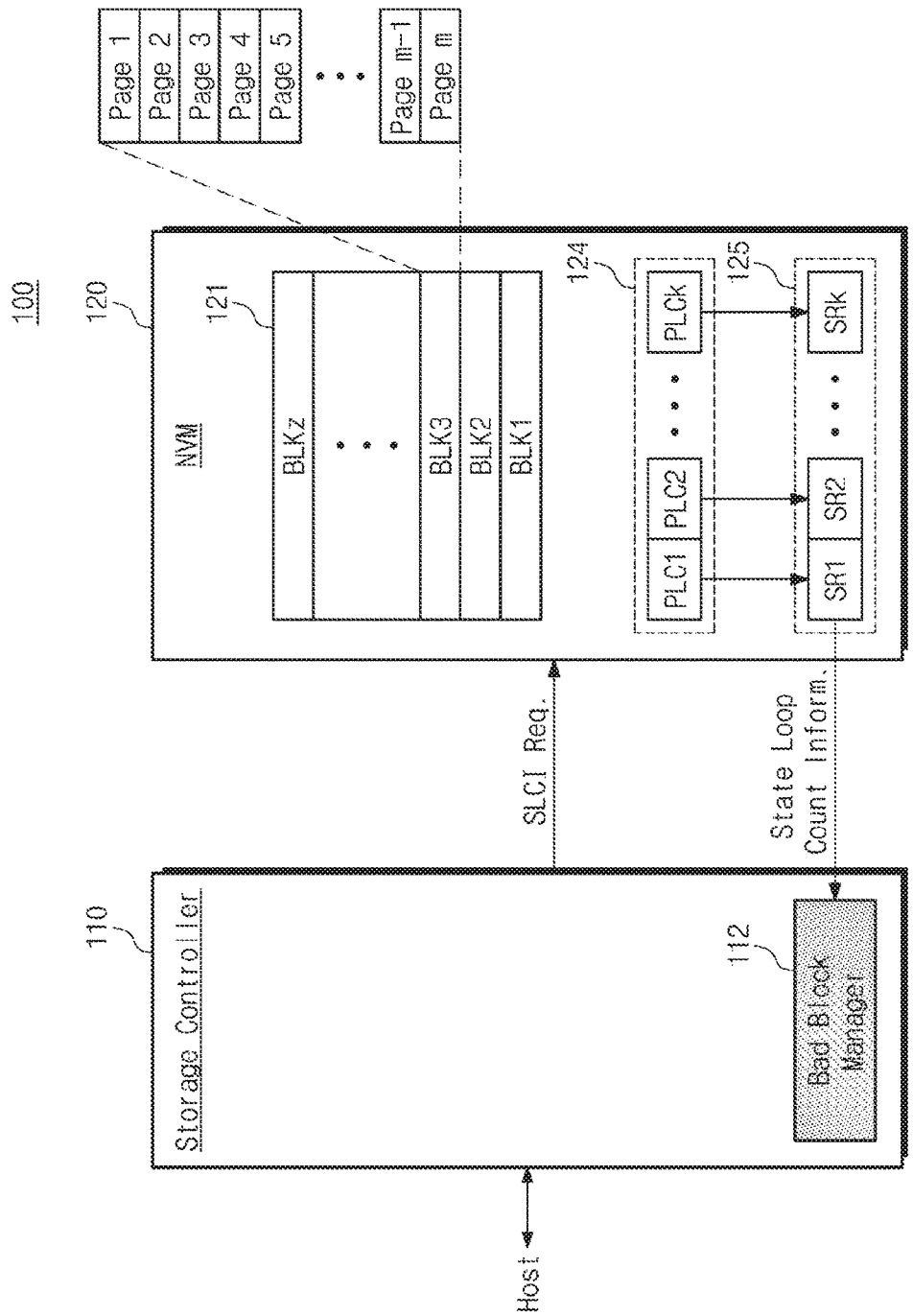
FIG. 1 illustrates a block diagram of a storage device according to an embodiment of the inventive concepts.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

It the following, a NAND flash memory device may be used as an example of a nonvolatile memory device for describing features and functions of the inventive concepts. However, one skilled in the art may easily understand other features and performances of the inventive concepts from information disclosed herein. For example, the inventive concepts may be used and applied to phase-change RAM (PRAM), magnetoresistive RAM (MRAM), resistive RAM (ReRAM), ferroelectric RAM (FRAM), and NOR flash memory, among other types of memory.

In this specification, various terms are used to describe a program operation of a nonvolatile memory device. A "program cycle" refers to a unit of a program operation that is needed to program selected memory cells (connected to the same word line) to target states, respectively. A "program loop" is composed of a plurality of operating units constituting the program cycle and includes pulses of a program voltage and a verification voltage. The program cycle may be composed of a plurality of program loops.

In addition, a "target state" used in this specification indicates that threshold voltages of memory cells are within a range in which data is distinguishable. A logical value may be allocated to a threshold voltage range. In addition, the term "status" indicating whether a program operation is successful or not refers to information meaning success or failure of one program cycle. In this specification, state loop count information (hereinafter referred to as "SLCI") may be mentioned. In this specification, the state loop count information SLCI is information indicating that each target state is programmed normally and the number of loops (or a loop count) needed for programming of each target state. That is, different program loop counts may be applied to program memory cells to target states corresponding to different threshold voltages. Each program state should be programmed within an appropriate program loop count. However, in the case where at least one of target states is programmed after the appropriate program loop count, the state loop count information SLCI may be set to indicate failure. The state loop count information SLCI refers to information indicating whether programming is performed successfully in units of each target state.

FIG. 1 illustrates a block diagram of a storage device according to an embodiment of the inventive concepts. Referring to FIG. 1, storage device 100 includes a storage controller 110 and a nonvolatile memory device 120. When a program operation (or cycle) is completed, the storage controller 110 may make a request to the nonvolatile memory device 120 for the state loop count information SLCI. The nonvolatile memory device 120 may output the state loop count information SLCI in response to the request of the storage controller 110. The storage controller 110 may perform various memory management operations including a bad block management operation by using a value of the state loop count information SLCI from the nonvolatile memory device 120.

The storage controller 110 controls the nonvolatile memory device 120. The storage controller 110 may provide the nonvolatile memory device 120 with a write command or write data in response to a write request from a host. When the write data are completely programmed, the storage controller 110 may provide the nonvolatile memory device 120 with a state loop count information request for checking a loop state of at least one of target states.

The storage controller 110 may monitor wear-leveling information of the nonvolatile memory device 120 in which the write data are programmed The storage controller 110 may provide the state loop count information request to the nonvolatile memory device 120 based on the monitoring result. Here, the wear-leveling information may include the number of program/erase (P/E) cycles.

In another embodiment, the storage controller 110 may monitor an operation temperature of the nonvolatile memory device 120 and may provide the state loop count information request to the nonvolatile memory device 120 based on the monitoring result. Alternatively, the storage controller 110 may provide the state loop count information request to the nonvolatile memory device 120 in response to a specific command from the host. The storage controller 110 may monitor the number of error bits of a memory area and may provide the state loop count information request to the nonvolatile memory device 120 based on the monitoring result.

The storage controller 110 may assign a selected memory block as a bad block with reference to the state loop count information SLCI from the nonvolatile memory device 120. For example, a bad block manager 112 may assign (or map) a memory block, in which the number of P/E cycles exceeds a specified reference value, as a bad block based on the state loop count information SLCI. Alternatively, in the case where an operation temperature of the nonvolatile memory device 120 exceeds a specified reference temperature, the bad block manager 112 may assign (or map) a selected memory block as a bad block with reference to the state loop count information SLCI. Also, in the case where the number of error bits detected from a selected memory block exceeds a specified reference value, the bad block manager 112 may assign (or map) the selected memory block as a bad block with reference to the state loop count information SLCI. In addition, in the case where the storage controller 110 receives a specific command from the host, the storage controller 110 may assign (or map) a selected memory block as a bad block with reference to the state loop count information SLCI from the nonvolatile memory device 120.

The nonvolatile memory device 120 includes a memory cell array 121 including a plurality of nonvolatile memory cells, a program loop count circuit 124, and a status register 125. The nonvolatile memory device 120 may detect a loop count and a loop state of each of selected target states through the program loop count circuit 124 and the status register 125 during a program operation. The program loop count circuit 124 counts or detects the number of program loops (i.e., the loop count) to completely (normally) program target states of a memory cell. The detected loop count and loop state (i.e., loop status) may be stored in the status register 125. The nonvolatile memory device 120 may output the state loop count information SLCI stored in the status register 125 in response to the state loop count information request from the storage controller 110.

It should be understood that the manner in which the nonvolatile memory device 120 outputs the state loop count information SLCI to the storage controller 110 may be implemented in various ways. For example, a request for the state loop count information SLCI may be provided in the form of a status read command, and a reserved bit of existing status data may be used to output the state loop count information SLCI. However, it should be understood that a channel for outputting the state loop count information SLCI may be implemented with an added signal output line.

According to the above-described storage device 100, a memory block may be assigned as a bad block based on the state loop count information SLCI, before an uncorrectable error occurs. Accordingly, the storage device 100 according to an embodiment of the inventive concepts may provide high integrity of data compared with a device that processes a memory block in which an uncorrectable error occurs as a bad block.

Figure 2:
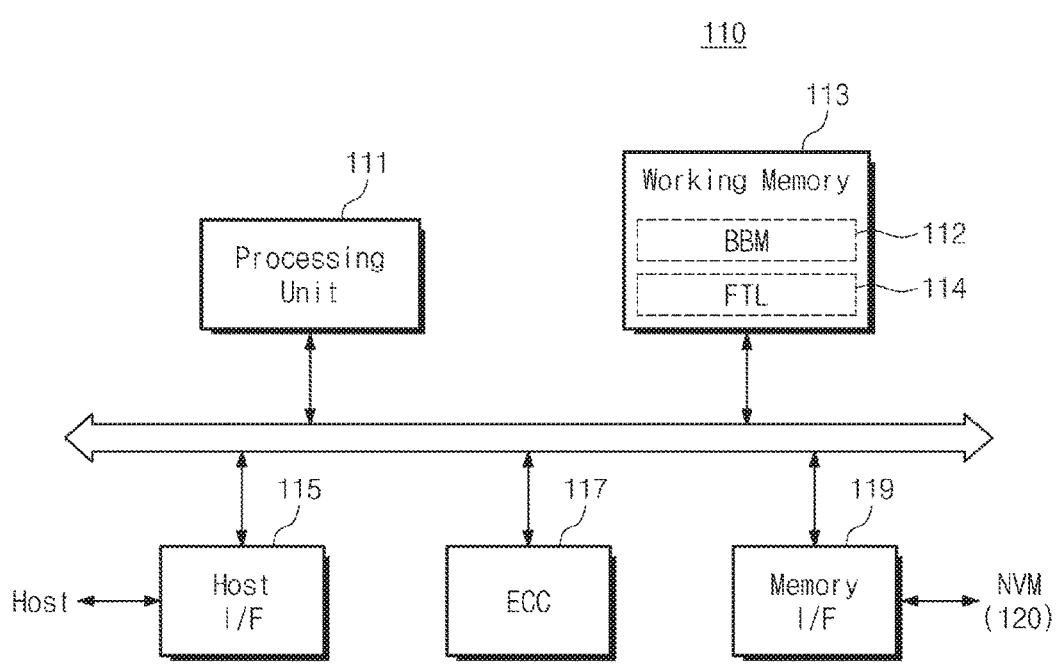
FIG. 2 illustrates a block diagram of a storage controller according to an embodiment of the inventive concepts.

FIG. 2 illustrates a block diagram of a storage controller according to an embodiment of the inventive concepts. Referring to FIG. 2, the storage controller 110 according to an embodiment of the inventive concept includes a processing unit 111, a working memory 113, a host interface (I/F) 115, an error correction code (ECC) unit 117, and a memory interface (I/F) 119, all interconnected by a bus. However, it should be appreciated that elements of the storage controller 110 are not limited to elements illustrated in FIG. 2. For example, the storage controller 110 may further include a read only memory (ROM) that stores code data needed for an initial booting operation.

The processing unit 111 may include a central processing unit or a micro-processor. The processing unit 111 may manage overall operations of the storage controller 110. The processing unit 111 may drive firmware for driving the storage controller 110. The firmware may be loaded on the working memory 113 and may be driven in response to a call of the processing unit 111.

The working memory 113 may be used to load software (or firmware) for controlling the storage controller 110 or data. The stored software and data may be driven or processed by the processing unit 111. The working memory 113 may include for example at least one of a cache memory device, a dynamic random access memory (DRAM) device, a static RAM (SRAM), a phase-change RAM (PRAM) device, and a flash memory device. According to an embodiment of the inventive concepts, the bad block manager (BBM) 112 or a flash translation layer (FTL) 114 may be loaded on the working memory 113.

The host interface 115 may provide an interface between the host and the storage controller 110. The host and the storage controller 110 may be connected through at least one of various standardized interfaces. The standardized interfaces may for example include an advanced technology attachment (ATA) interface, a serial ATA (SATA) interface, an external SATA (e-SATA) interface, a small computer small interface (SCSI), a serial attached SCSI (SAS), a peripheral component interconnection (PCI) interface, a PCI Express (PCI-E) interface, a universal serial bus (USB) interface, an IEEE 1394 interface, a universal flash storage (UFS) interface, a M.2 SSD interface, and M.3 SSD interface, among other types of standardized interfaces.

The ECC unit 117 may correct an error of data generated due to various causes. For example, the ECC unit 117 may perform an operation for detecting and correcting an error of data read from the nonvolatile memory device 120. In particular, the ECC unit 117 may detect the number of error bits of the read data. In an embodiment, the number of detected error bits nEB may be provided to the bad block manager 112. The bad block manager 112 may assign a selected memory block as a bad block by using the number of error bits and the state loop count information SLCI.

The memory interface 119 may provide an interface between the storage controller 110 and the nonvolatile memory device 120. For example, data processed by the processing unit 111 may be stored in the nonvolatile memory device 120 through the memory interface 119. As another example, data stored in the nonvolatile memory device 120 may be provided to the processing unit 111 through the memory interface 119.

The elements of the storage controller 110 are exemplified above. The state loop count information SLCI may be provided from the nonvolatile memory device 120 to the storage controller 110 according to an embodiment of the inventive concepts. The storage controller 110 may make a request to the nonvolatile memory device 120 for the state loop count information SLCI in response to a request from the host or depending on an operation temperature, the number of P/E cycles, and the number of error bits nEB of the nonvolatile memory device 120. The storage controller 110 may assign a selected memory block as a bad block with reference to the state loop count information SLCI.

Figure 3:
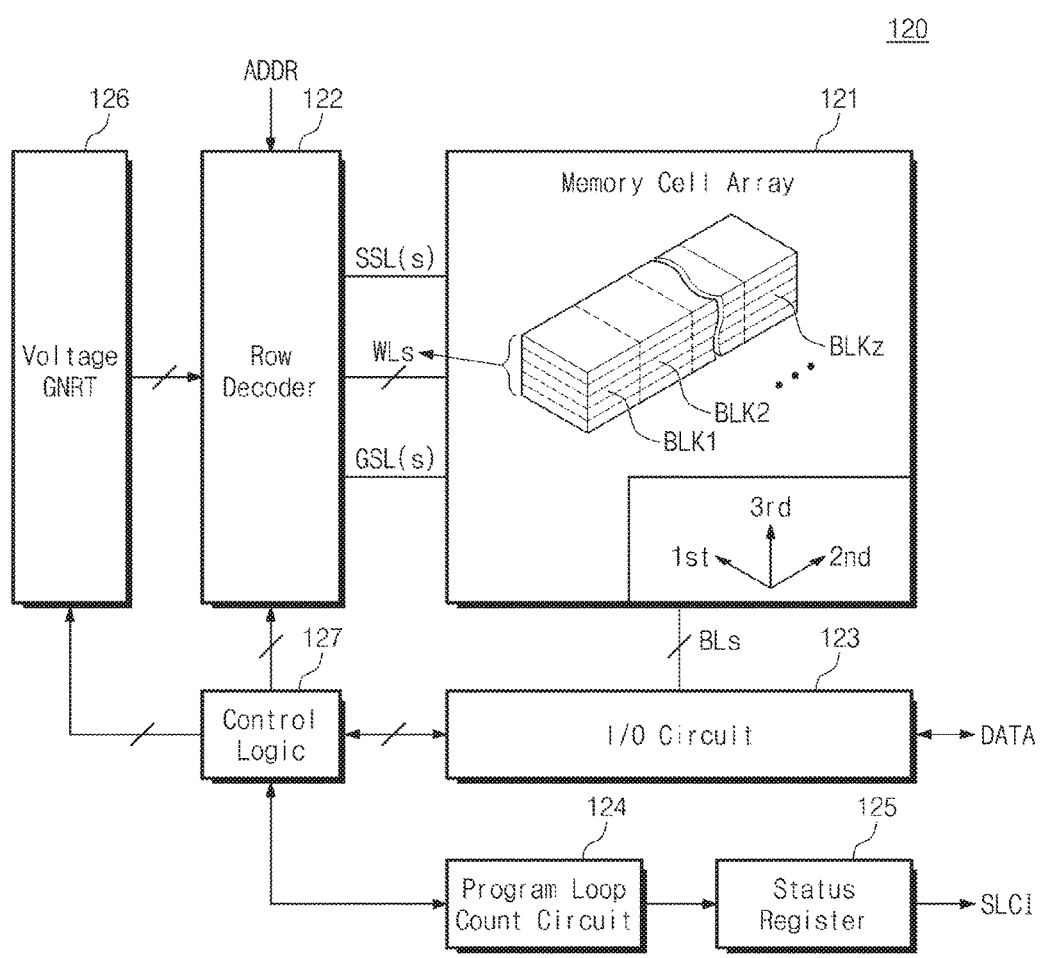
FIG. 3 illustrates a block diagram of a nonvolatile memory device according to an embodiment of the inventive concepts.

FIG. 3 illustrates a block diagram of a nonvolatile memory device according to an embodiment of the inventive concepts. Referring to FIG. 3, the nonvolatile memory device 120 includes the memory cell array 121, a row decoder 122, an input/output (I/O) circuit 123, a program loop count circuit 124, a status register 125, a voltage generator (GNRT) 126, and control logic 127.

The memory cell array 121 is connected to the row decoder 122 through word lines WLs, string selection lines SSLs and/or ground selection lines GSLs. The memory cell array 121 may be connected to a page buffer (not illustrated) and the input/output circuit 123 through bit lines BLs. The memory cell array 121 includes a plurality of memory blocks BLK1, BLK2 to BLKz (i.e., memory blocks BLK1 to BLKz). Each of the memory blocks BLK1 to BLKz includes a plurality of cell strings. Here, a channel of each cell string may be formed in a vertical or horizontal direction. The memory cells included in the memory cell array 121 are programmed by voltages that are provided to word lines and bit lines.

As an embodiment of the inventive concepts, the memory cell array 121 may be implemented as including a three-dimensional (3D) memory array. The 3D memory array may be monolithically formed in one or more physical levels of arrays of memory cells having an active area disposed above a silicon substrate and circuitry associated with the operation of those memory cells. The circuitry related to an operation of memory cells may be located in a substrate or on a substrate. The term "monolithic" means that layers of each level of the array are directly deposited on the layers of each underlying level of the 3D array.

The row decoder 122 may select one of the memory blocks BLK1 to BLKz of the memory cell array 121 in response to an address ADDR. The row decoder 122 may select one of word lines of the selected memory block. The row decoder 122 may transfer a word line voltage $V_{WL}$ from the voltage generator 126 to the selected word line. During a program operation, the row decoder 122 may transfer a program/verification voltage to the selected word line and a pass voltage Vpass to each of unselected word lines.

During the program operation, the input/output circuit 123 writes received write data in selected memory cells of the memory cell array 121. During a read operation, the input/output circuit 123 reads data from selected memory cells of the memory cell array 121. The input/output circuit 123 may output the read data to the outside of the nonvolatile memory device 120.

During the program operation, the program loop count circuit 124 may check whether memory cells are programmed normally to target states, in units of a program loop. The program loop count circuit 124 may detect whether programming is successful, for each program loop while one program cycle is performed. In the case where any one target state is determined as being a program pass at an abnormal loop count, the program loop count circuit 124 may set the state loop count information SLCI to failure. It should be understood that loop count values of the respective target states are included in the state loop count information SLCI.

The status register 125 stores the state loop count information SLCI. If the state loop count information SLCI is requested from the outside, the status register 125 may output the state loop count information SLCI.

The voltage generator 126 may generate various word line voltages $V_{WL}$ to be supplied to word lines and a voltage to be supplied to a bulk (e.g., a well area) in which memory cells are formed, under control of the control logic 127. The word line voltages to be supplied to the word lines may include a program voltage Vpgm, a pass voltage Vpass, and selection and non-selection read voltages Vrd and Vread, among other possible voltages. The voltage generator 126 may further generate selection line voltages $V_{SSL}$ and $V_{GSL}$ to be provided to the string selection lines SSL and the ground selection lines GSL during a read operation and a program operation. Also, under control of the control logic 127, the voltage generator 126 may generate a verification voltage Vfy and may provide the verification voltage Vfy to the row decoder 122.

The control logic 127 may control the row decoder 122, the input/output circuit 123, the program loop count circuit 124, and the voltage generator 126 in response to a command from the outside (not shown). The control logic 127 may control the voltage generator 126 and the input/output circuit 123 in response to a write command such that data (DATA) from the outside are programmed in selected memory cells. For example, the selected memory cells may be programmed in an incremental step pulse programming (ISPP) scheme under control of the control logic 127.

In the ISPP scheme, there is performed a program cycle for programming the selected memory cells (e.g., memory cells connected to one word line). One program cycle (or program operation) is composed of a plurality of program loops. In each program loop, at least one program pulse and at least one verification pulse are used. The program pulse is a pulse having a level of the program voltage Vpgm, and the verification pulse is a pulse having a level of the verification voltage Vfy. In the ISPP scheme, a level of the program voltage Vpgm may increase as a loop count increases.

With the above description, the nonvolatile memory device 120 may detect the case where at least one among a plurality of target states is completely programmed at an abnormal loop count. The nonvolatile memory device 120 may store the detection result as the state loop count information SLCI.

Figure 4:
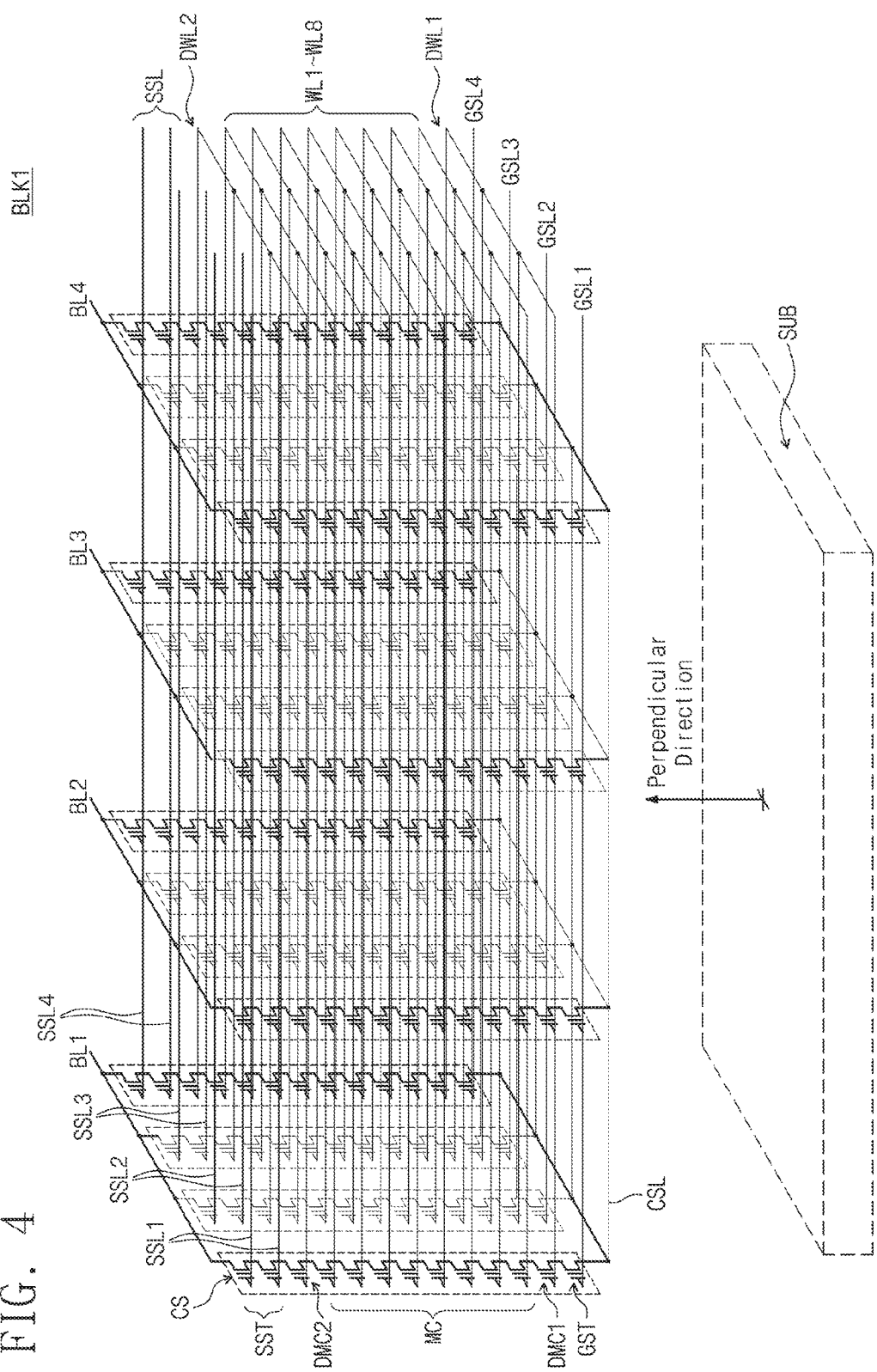
FIG. 4 illustrates a view of a structure of a memory cell array of FIG. 3.

FIG. 4 illustrates a view of a structure of a memory cell array of FIG. 3. Referring to FIG. 4, a circuit structure of the memory block BLK1 included in the memory cell array 121 is illustrated.

A plurality of cell strings CS may be arranged on a substrate SUB in rows and columns The cell strings CS may be connected in common to a common source line CSL that is formed on (or in) the substrate SUB. A location of the substrate SUB is exemplified to help understand a structure of the memory block BLK1. The embodiment as shown in FIG. 4 is exemplified whereby the common source line CSL is connected to lower ends of the cell strings CS. However, in other embodiments the common source line CSL may instead be electrically connected to upper ends of the cell strings CS. Embodiments of the inventive concepts should not be limited to the case that the common source line CSL is physically located at the lower ends of the cell strings CS. The embodiment as shown in FIG. 4 is further exemplified whereby the cell strings CS are arranged in a four-by-four matrix. However, in other embodiments the number of cell strings CS in the memory block BLK1 may increase or decrease.

Cell strings of each row may be connected to a corresponding one of first to fourth ground selection lines GSL1 to GSL4 and a corresponding one of first to fourth string selection lines SSL1 to SSL4. Cell strings of each column may be connected to a corresponding one of first to fourth bit lines BL1 to BL4. For ease of illustration, cell strings that are connected to the second and third ground selection lines GSL2 and GSL3 or the second and third string selection lines SSL2 and SSL3 are depicted to be blurry. In the embodiment of FIG. 4, the bit lines BL1 to BL4 may be characterized as extending along the 1st direction shown in FIG. 3.

Each cell string CS may include at least one ground selection transistor GST connected to a corresponding ground selection line, a first dummy memory cell DMC1 connected to a first dummy word line DWL1, a plurality of memory cells MC respectively connected to a plurality of word lines WL1 to WL8, a second dummy memory cell DMC2 connected to a second dummy word line DWL2, and string selection transistors SST respectively connected to string selection lines SSL. In the embodiment of FIG. 4, the first dummy word line DWL1, the plurality of word lines WL1 to WL8, the second dummy word line DWL2 the ground selection lines GSL1 to GSL4 and the string selection lines SSL1 to SSL4 may be characterized as extending along the 2nd direction shown in FIG. 3. In each cell string CS, the ground selection transistor GST, the first dummy memory cell DMC1, the memory cells MC, the second dummy memory cell DMC2, and the string selection transistors SST may be serially connected to each other along a direction perpendicular to the substrate SUB and may be sequentially stacked along a direction perpendicular to the substrate SUB.

In an embodiment, as illustrated in FIG. 4, one or more dummy memory cells may be arranged between the ground selection transistor GST and the memory cells MC in each cell string CS. In each cell string CS, one or more dummy memory cells may be arranged between the string selection transistors SST and the memory cells MC. In each cell string CS, one or more dummy memory cells may be arranged between the memory cells MC. The dummy memory cells may have the same structure as the memory cells MC and may not be programmed (e.g., program inhibited) or may be programmed differently from the memory cells MC. For example, when memory cells are programmed to form two or more threshold voltage distributions, the dummy memory cells may be programmed to have one threshold voltage distribution range or to have threshold voltage distributions of which the number is less than the number of the threshold voltage distributions of the memory cells MC.

Gates of memory cells of the cell strings CS that are located at the same height (or order) from the substrate SUB or the ground selection transistor GST may be electrically connected in common to each other. Gates of memory cells of the cell strings CS that are located at different heights (or orders) from the substrate SUB or the ground selection transistor GST may be electrically separated from each other. In the embodiment as shown in FIG. 4, memory cells of the same height are connected to the same word line. However, in other embodiments the memory cells of the same height may be directly connected to each other in a plane where the memory cells are formed or may be indirectly connected to each other through another layer such as a metal layer.

Memory cells that correspond to a string (or ground) selection line and a word line may constitute a page. A write operation and a read operation may be performed by the page. In each page, each memory cell may store two or more bits. Bits that are written in memory cells belonging to one page may form logical pages. For example, k-th bits that are respectively written in memory cells of each page may form a k-th logical page.

The memory block BLK1 may be provided as a 3D memory array as shown in FIG. 4. The 3D memory array is monolithically formed in one or more physical levels of arrays of memory cells MC having an active area disposed above a silicon substrate and circuitry associated with the operation of those memory cells MC. The circuitry associated with an operation of memory cells MC may be located above or within such substrate. The term "monolithic" means that layers of each level of the 3D array are directly deposited on the layers of each underlying level of the 3D array.

In an embodiment of the inventive concept, the 3D memory array includes vertical NAND strings (or cell strings) that are vertically oriented (e.g., along the 3rd direction shown in FIG. 3) such that at least one memory cell is located over another memory cell. The at least one memory cell may comprise a charge trap layer. Each vertical NAND string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and 9,536,970.

The memory cell array 121 of the 3D-structured nonvolatile memory device 120 may have a high degree of integration. However, during a program operation the nonvolatile memory device 120 may be sensitive to influences of an environment peripheral to the nonvolatile memory device 120. Accordingly, although the number of program loops needed for a program cycle associated with selected memory cells may be normal, some of target states of the selected memory cells may however form an inappropriate distribution due to noise or environmental influence.

The state loop count information SLCI according to an embodiment of the inventive concepts is provided as parameter information for determining whether a distribution of each target state is normal. Whether programming of each target state is performed normally may be determined by observing a state loop count needed for memory cells to have threshold voltages of target states. Potential defects of a memory cell may thus be detected in advance by determining whether a program operation is performed normally or by assigning a memory block having the potential defects as a bad block, with reference to the state loop count information SLCI. Accordingly, it may be possible to predict and cope with occurrence of a run time bad block RTBB, which markedly increases in a 3D-structured nonvolatile memory device 120.

Figure 5:
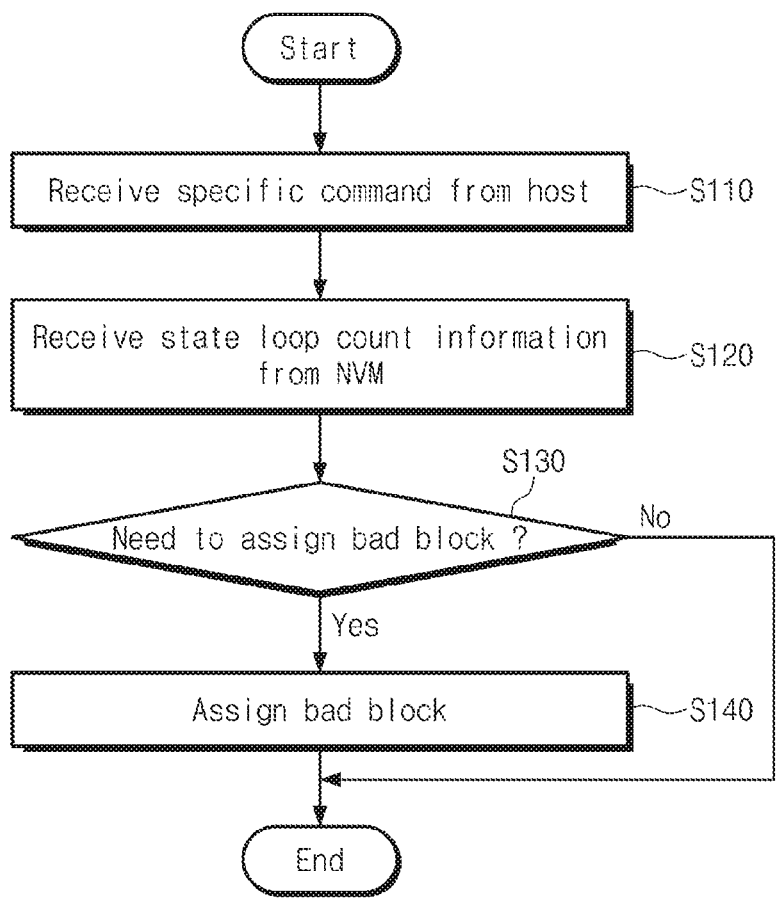
FIG. 5 illustrates a flowchart of a memory management operation of the storage device according to an embodiment of the inventive concepts.

FIG. 5 illustrates a flowchart of a memory management operation of a storage device according to an embodiment of the inventive concepts. Referring to FIG. 5, the storage device 100 (referring to FIG. 1) may perform a bad block processing operation (i.e., a run time bad block (RTBB) processing operation), which makes use of the state loop count information SLCI, in response to a specific command from the host. In some embodiments, the specific command may be an external command received from the outside of the storage device 100 shown in FIG. 1.

In operation S110, the storage controller 110 is provided with (i.e., receives) the specific command from the host. Here, the specific command may be a command or a request provided from the host to improve the reliability of the storage device 100. Alternatively, the specific command may be a separately defined bad block processing command In operation S120, the storage controller 110 makes a request to the nonvolatile memory device 120 for the state loop count information SLCI in response to the specific command from the host. The storage controller 110 may make a request to the nonvolatile memory device 120 for the state loop count information SLCI of a selected memory block or all memory blocks. In response to the request, the nonvolatile memory device 120 may output the state loop count information SLCI stored in the status register 125 to the storage controller 110. The storage controller 110 receives the state loop count information SLCI from the nonvolatile memory device 120.

In operation S130, the storage controller 110 determines whether to assign the selected memory block as a bad block by using the state loop count information SLCI. The number of program loops needed in a program cycle associated with memory cells of the selected memory block may be normal. However, by using the state loop count information SLCI it may be detected whether loop counts of some of the target states are out of a reference range (e.g., an SPL reference range and a DL reference range as will be subsequently described with respect to FIG. 10). The storage controller 110 may thus in advance detect a memory block that will become a run time bad block RTBB based on the state loop count information SLCI. If it is determined that loop counts of some of the target states are out of the reference range and that the selected memory block needs to be assigned as a bad block (Yes) in operation S130, the procedure proceeds to operation S140. If it is determined that loop counts of the target states are not out of the reference range and that the selected memory block does not need to be assigned as a bad block (No) in operation S130, the run time bad block (RTBB) processing operation that is performed according to the specific command ends.

In operation S140, the storage controller 110 assigns the selected memory block as a bad block. Afterwards, the memory block assigned as the bad block may not be used any more to store data. Accordingly, a memory block in which the number of program loops needed for the program operation is not problematic, but in which some of the target states have loop counts that are problematic, may be processed as a bad block. According to this embodiment, the storage controller 110 may detect occurrence of a bad block in advance before an uncorrectable error occurs, to thus improve the integrity of data of the storage device 100.

Figure 6:
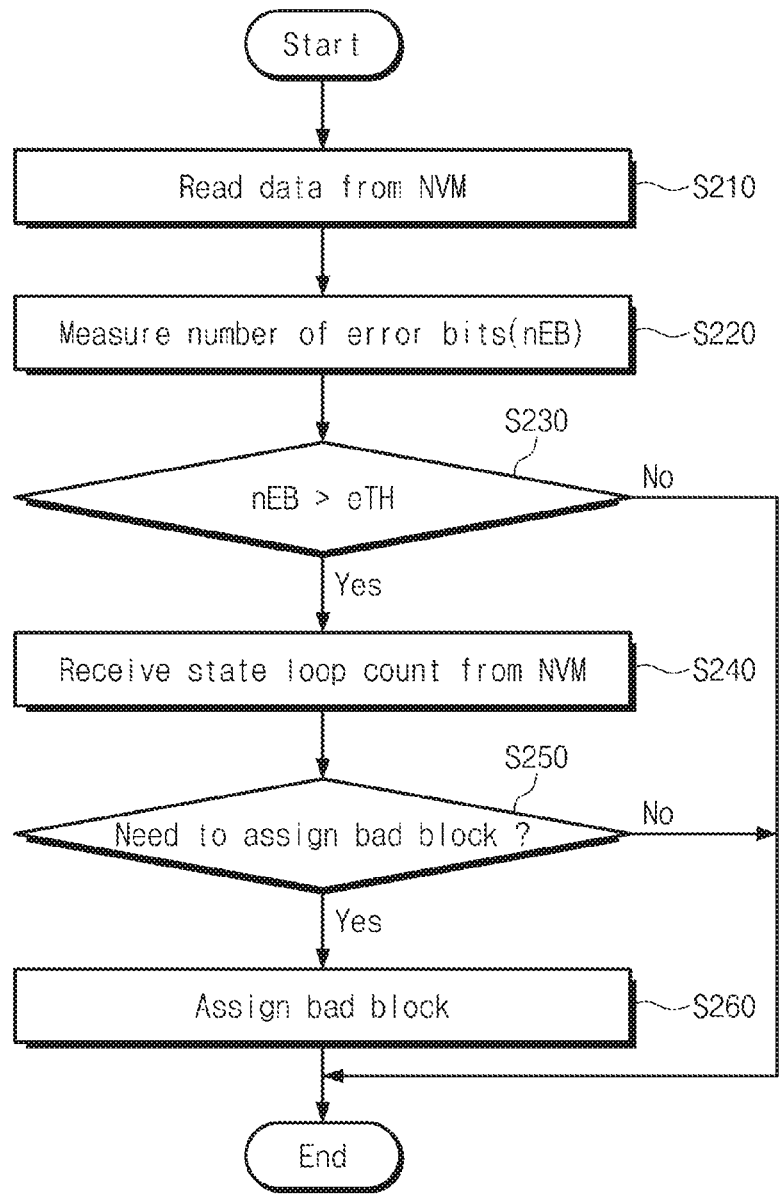
FIG. 6 illustrates a flowchart of another example of the memory management operation of the storage device according to an embodiment of the inventive concepts.

FIG. 6 illustrates a flowchart of another example of a memory management operation of a storage device according to an embodiment of the inventive concepts. Referring to FIG. 6, the storage device 100 (refer to FIG. 1) may perform a bad block processing operation, which makes use of the state loop count information SLCI according to an embodiment of the inventive concepts, with reference to the number of error bits nEB included in read data.

In operation S210, the storage controller 110 reads data from the nonvolatile memory device 120. The data read operation may be performed as part of or responsive to a host request or a memory management operation.

In operation S220, the storage controller 110 detects or measures the number of error bits nEB in the read data. For example, the storage controller 110 may detect the number of error bits nEB in the read data in units of a page, a sector, a word line, or a block. However, in other embodiments the number of error bits nEB in the read data may be detected in units other than units of a page, a sector, a word line, or a block.

In operation S230, the storage controller 110 compares the number of error bits nEB with a specified reference value eTH. For example, the specified reference value eTH may be smaller than a reference value for an uncorrectable error. The specified reference value eTh may be set to a value that is smaller than the reference value for the uncorrectable error and makes it possible to prevent occurrence of the run time bad block RTBB in advance. The reference value eTh may be set to various values depending on an error correction algorithm or engine of the ECC unit 117 (refer to FIG. 2). If the number of error bits nEB is larger than the reference value eTH (Yes) in operation S230, the procedure proceeds to operation S240. In contrast, if the number of error bits nEB is smaller than or equal to the reference value eTH (No) in operation S230, the procedure ends.

In operation S240, the storage controller 110 makes a request to the nonvolatile memory device 120 for the state loop count information SLCI. The storage controller 110 may make a request to the nonvolatile memory device 120 for the state loop count information SLCI of a selected memory block. In response to the request, the nonvolatile memory device 120 may output the state loop count information SLCI stored in the status register 125. The storage controller 110 receives the state loop count information SLCI from the nonvolatile memory device 120. In other words, in the memory management operation of this embodiment, the storage controller 110 makes a request the nonvolatile memory device 120 for the state loop count information SLCI of a selected memory block in response to detection of an operation condition (i.e., the number of error bits nEB in the read data).

In operation S250, the storage controller 110 determines whether to assign the selected memory block as a bad block by using the state loop count information SLCI. The number of program loops needed in a program cycle associated with memory cells of the selected memory block may be normal. However, by using the state loop count information SLCI it may be detected whether loop counts of some of target states are out of a reference range (e.g., an SPL reference range and a DL reference range as will be subsequently described with respect to FIG. 10). If it is determined that loop counts of some of the target states are out of the reference range and that the selected memory block needs to be assigned as a bad block (Yes) in operation S250, the procedure proceeds to operation S260. In contrast, if it is determined that loop counts of the target states are not out of the reference range and that the selected memory block does not need to be assigned as a bad block (No) in operation S250, the run time bad block (RTBB) processing operation that is performed with reference to the number of error bits nEB ends.

In operation S260, the storage controller 110 assigns the selected memory block as a bad block. Afterwards, the memory block assigned as the bad block may not be used any more to store data. Accordingly, a memory block in which the number of program loops needed for the program operation is not problematic, but in which some of the target states have loop counts that are problematic, may be processed as a bad block. Since occurrence of the run time bad block RTBB may be detected before an uncorrectable error occurs, the integrity of data of the storage device 100 may be improved.

Figure 7:
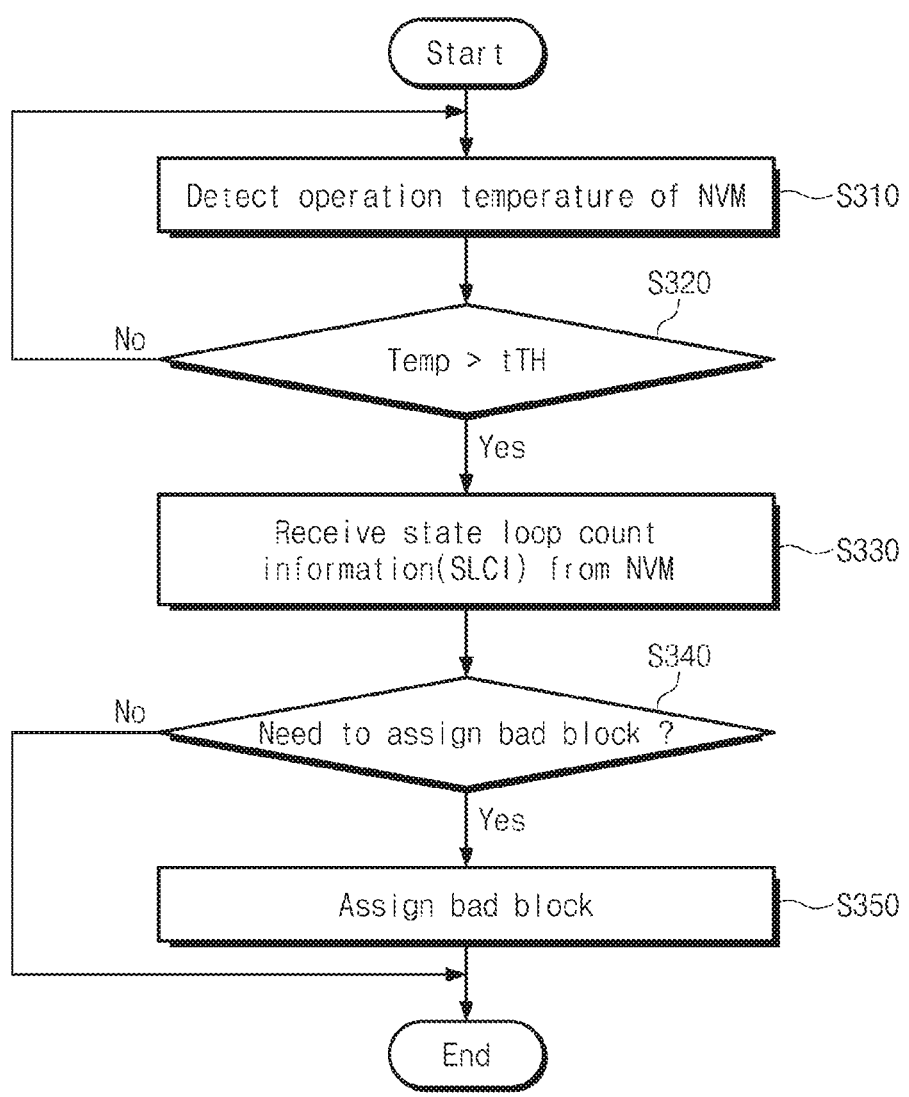
FIG. 7 illustrates a flowchart of another example of the memory management operation of the storage device according to an embodiment of the inventive concepts.

FIG. 7 illustrates a flowchart of another example of a memory management operation of a storage device according to an embodiment of the inventive concepts. Referring to FIG. 7, the storage device 100 (refer to FIG. 1) may perform a bad block processing operation by using an operation temperature Temp and the state loop count information SLCI of the nonvolatile memory device 120.

In operation S310, the storage controller 110 detects the operation temperature Temp of the nonvolatile memory device 120. The operation temperature Temp of the nonvolatile memory device 120 may be measured by using a temperature sensor (not shown) that may be located inside or outside the nonvolatile memory device 120. For example, the storage controller 110 may periodically detect the operation temperature Temp of the nonvolatile memory device 120.

In operation S320, the storage controller 110 compares the detected operation temperature Temp and a specified reference temperature tTH. For example, the specified reference temperature tTh may be at or near an upper limit of a recommended operational temperature range of the nonvolatile memory device 120. If the detected operation temperature Temp is higher than the specified reference temperature tTH (Yes) in operation S320, the procedure proceeds to operation S330. In contrast, if the detected operation temperature Temp is lower than or equal to the specified reference temperature tTH (No) in operation S320, the procedure returns to operation S310.

In operation S330, the storage controller 110 makes a request to the nonvolatile memory device 120 for the state loop count information SLCI. The storage controller 110 may make a request to the nonvolatile memory device 120 for the state loop count information SLCI of a selected memory block. In response to the request, the nonvolatile memory device 120 may output the state loop count information SLCI stored in the status register 125 to the storage controller 110. The storage controller 110 receives the state loop count information SLCI from the nonvolatile memory device 120. In other words, in the memory management operation of this embodiment, the storage controller 110 makes a request the nonvolatile memory device 120 for the state loop count information SLCI of a selected memory block in response to detection of an operation condition (i.e., the operation temperature Temp of the nonvolatile memory device 120).

In operation S340, the storage controller 110 determines whether to assign the selected memory block as a bad block by using the state loop count information SLCI. Similarly as in step S250 described with respect to FIG. 6, if it is determined that loop counts of some of the target states are out of the reference range and that the selected memory block needs to be assigned as a bad block (Yes) in operation S340, the procedure proceeds to operation S350. In contrast, if it is determined that loop counts of the target states are not out of the reference range and that the selected memory block does not need to be assigned as a bad block (No) in operation S340, the run time bad block (RTBB) processing operation that is performed with reference to the operation temperature Temp ends.

In operation S350, the storage controller 110 assigns the selected memory block as a bad block. Afterwards, the memory block assigned as the bad block may not be used any more to store data. Accordingly, a memory block in which the number of program loops needed for the program operation is not problematic, but in which some of the target states have loop counts that are problematic at a specific temperature or higher, may be processed as a bad block.

Figure 8:
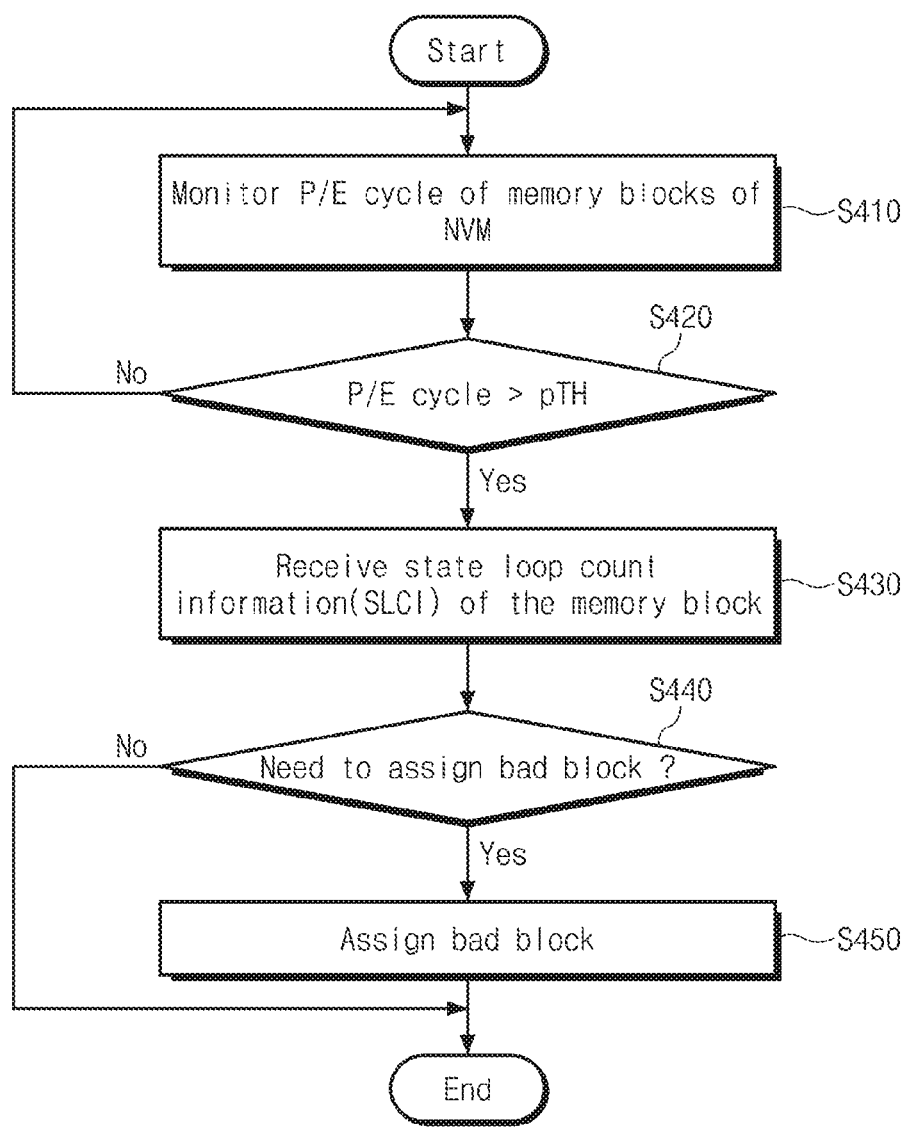
FIG. 8 illustrates a flowchart of another example of the memory management operation of the storage device according to an embodiment of the inventive concepts.

FIG. 8 illustrates a flowchart of another example of a memory management operation of a storage device according to an embodiment of the inventive concepts. Referring to FIG. 8, the storage device 100 (refer to FIG. 1) may perform a bad block processing operation by using the number of P/E cycles and the state loop count information SLCI of the nonvolatile memory device 120.

In operation S410, the storage controller 110 detects the number of P/E cycles of the nonvolatile memory device 120. The number of P/E cycles of each of memory blocks included in the nonvolatile memory device 120 may be managed and updated in the storage controller 110 in the form of a table.

In operation S420, the storage controller 110 compares the number of P/E cycles of each memory block and a specified reference count pTh. If the detected number of P/E cycles is larger than the specified reference count pTh (Yes) in operation S420, the procedure proceeds to operation S430. In contrast, if the detected number of P/E cycles is smaller than or equal to the specified reference count pTh (No) in operation S420, the procedure returns to operation S410.

In operation S430, the storage controller 110 makes a request to the nonvolatile memory device 120 for the state loop count information SLCI. The storage controller 110 may make a request to the nonvolatile memory device 120 for the state loop count information SLCI of a selected memory block. In response to the request, the nonvolatile memory device 120 may output the state loop count information SLCI stored in the status register 125 to the storage controller 110. The storage controller 110 receives the state loop count information SLCI from the nonvolatile memory device 120. In other words, in the memory management operation of this embodiment, the storage controller 110 makes a request the nonvolatile memory device 120 for the state loop count information SLCI of a selected memory block in response to detection of an operation condition (i.e., the number of P/E cycles of the nonvolatile memory device 120).

In operation S440, the storage controller 110 determines whether to assign the selected memory block as a bad block by using the state loop count information SLCI. The number of program loops needed in a program cycle associated with memory cells of the selected memory block may be normal. However, by using the state loop count information SLCI it may be detected whether loop counts of some of the target states are out of a reference range. Similarly as in step S250 described with respect to FIG. 6, if it is determined that loop counts of some of the target states are out of the reference range and that the selected memory block needs to be assigned as a bad block (Yes) in operation S440, the procedure proceeds to operation S450. In contrast, if it is determined that loop counts of the target states are not out of the reference range and that the selected memory block does not need to be assigned as a bad block (No), the run time bad block (RTBB) processing operation that is performed with reference to the number of P/E cycles ends.

In operation S450, the storage controller 110 assigns the selected memory block as a bad block. Afterwards, the memory block assigned as the bad block may not be used any more to store data. Accordingly, a memory block in which the number of program loops needed for the program operation is not problematic, but in which some of the target states have loop counts that are problematic and have P/E cycles at a specific number or higher, may be processed as a bad block.

Embodiments of the inventive concepts including a bad block processing method using any one of a specific command, the number of error bits, an operation temperature, and the number of P/E cycles and the state loop count information SLCI are described above. However, bad block processing methods of the inventive concepts are not limited as described with respect to FIGS. 5-8. It should be understood that in other embodiments of the inventive concepts bad block processing methods may include a combination of at least two or more of a specific command, the number of error bits, an operation temperature, and the number of P/E cycles used together with the state loop count information SLCI to detect a run time bad block in advance.

Figure 9:
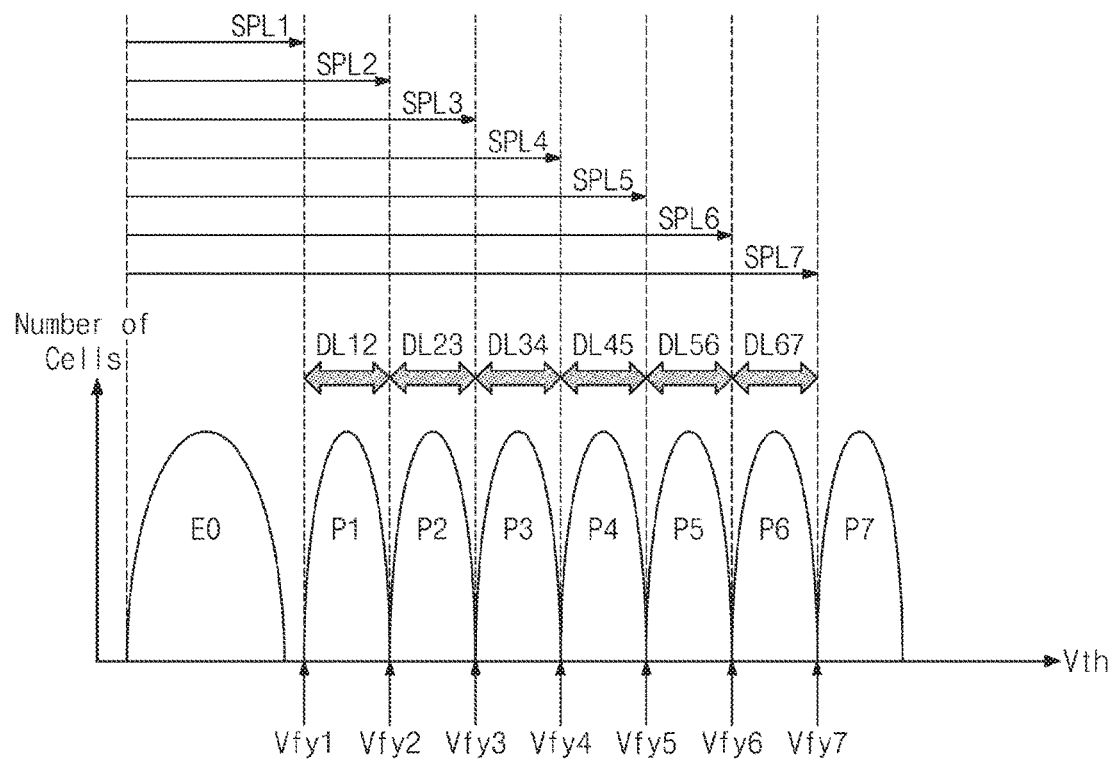
FIG. 9 illustrates a view for describing the state loop count information SLCI according to an embodiment of the inventive concepts.

FIG. 9 illustrates a view for describing the state loop count information SLCI according to an embodiment of the inventive concept. In FIG. 9, a threshold voltage distribution of a nonvolatile memory device storing state loop count information is shown. Referring to FIG. 9, an example of the state loop count information SLCI including a state pass loop SPL and a delta loop DL will be described. In an embodiment, the state pass loop SPL and the delta loop DL will be described with reference to triple level cells (TLCs) each having one of an erase state E0 and seven target states P1, P2, P3, P4, P5, P6, and P7.

Each of selected memory cells may have a threshold voltage level corresponding to the erase state E0 initially. Each of the selected memory cells may have a threshold voltage belonging to one of the states E0, P1, P2, P3, P4, P5, P6, and P7 as the program operation is executed. Through the program operation, threshold voltages of the selected memory cells may increase from a target state of a low level to a target state of a high level. For example, memory cells that are to be programmed to the target state P1 may be detected as program pass at a loop count that is smaller than that of the target state P2.

Whether memory cells to be programmed to the target state P1 are successfully programmed may be detected by a verification voltage Vfy1. If it is detected that the memory cells to be programmed to the target state P1 are successfully programmed by use of the verification voltage Vfy1, the memory cells may be set to program inhibit, and thus, the memory cells may be released from influence of the program voltage. In an embodiment of the inventive concepts, it is assumed that the memory cells to be programmed to the target state P1 are completely programmed at a first state pass loop SPL1. That is, the first state pass loop SPL1 indicates the loop count or number of loops necessary to completely program the memory cells to the target state P1.

Whether memory cells to be programmed to the target state P2 higher than the target state P1 are successfully programmed may be detected by a verification voltage Vfy2. If it is detected that the memory cells to be programmed to the target state P2 are successfully programmed, the memory cells may be set to the program inhibit, and thus, the memory cells may be released from influence of the program voltage. It is assumed that the memory cells to be programmed to the target state P2 are completely programmed at a second state pass loop SPL2. That is, the second state pass loop SPL2 indicates the loop count or number of loops necessary to completely program the memory cells to the target state P2.

The first state pass loop SPL1 and the second state pass loop SPL2 are respectively consumed to program the memory cells to the target states P1 and P2. Likewise, state pass loops SPL3, SPL4, SPL5, SPL6, and SPL7 may be respectively consumed to program memory cells to the target states P3, P4, P5, P6, and P7. A delta loop corresponding to a difference between state pass loops may be determined under the above-described conditions of the state pass loops. A delta loop DL12 between the target states P1 and P2 corresponds to a difference between the first state pass loop SPL1 and the second state pass loop SPL2. A delta loop DL23 between the target states P2 and P3 corresponds to a difference between the second state pass loop SPL2 and the third state pass loop SPL3. A delta loop DL34 between the target states P3 and P4 corresponds to a difference between the third state pass loop SPL3 and the fourth state pass loop SPL4. With the above description, a difference between the sixth pass loop SPL6 and the seventh pass loop SPL7 may be determined as a delta loop DL67 between the target states P6 and P7. That is, delta loops DL45 and DL56 are defined in a similar manner as described.

A state pass loop SPLi (i being an integer from 1 to 7) and a delta loop DL, which correspond to each of the target states P1, P2, P3, P4, P5, P6, and P7, may be determined to have values according to the optimum data reliability, based on the relationship between the target states and the loop counts. The optimum state pass loop SPLi and the optimum delta loop DL may be obtained through testing or simulation that is made in consideration of various characteristics of the nonvolatile memory device 120. An allowable range for providing an appropriate margin may be determined on the basis of the optimum state pass loop SPLi and the optimum delta loop DL thus obtained.

FIG. 10 illustrates a table including the state loop count information SLCI. Referring to FIG. 10, to store the state loop count information SLCI, allowable ranges of the state pass loop SPL and the delta loop DL may be defined with respect to each target state of FIG. 9. The table including the state loop count information SLCI as shown in FIG. 10 may for example be stored in status register 125 of the nonvolatile memory device 120 as shown in FIGS. 1 and 3.

When a program operation is performed, the state pass loops SPL of the target states P1 to P7 may be stored. The delta loop DL may be determined according to a result of calculating a difference between the stored state pass loops SPL. In the embodiment of FIG. 10, the state pass loop SPL (i.e., SPL1) of the target state P1 is illustrated as being "7". That is, the loop count (or number of loops) necessary to completely program the memory cells to the target state P1 was "7". The state pass loop SPL of the target state P2 (i.e., SPL2) is illustrated in FIG. 10 as being "10". That is, the loop count (or number of loops) necessary to completely program the memory cells to the target state P2 was "10". The state pass loop SPL of the target state P3 (i.e., SPL3) is illustrated in FIG. 10 as being "13". That is, the loop count (or number of loops) necessary to completely program the memory cells to the target state P3 was "13". The state pass loops SPL of the target states P4 to P7 are illustrated in FIG. 10 as being "16", "19", "22", and "25", respectively.

If the state pass loops SPL of the target states P1 to P7 are provided, the delta loops DL that are differences between the state pass loops SPL corresponding to the target states P1 to P7 may be calculated. A difference "3" (10−7=3) between the state pass loops SPL of the target states P1 and P2 may be determined as the delta loop DL of the target states P2. Likewise, a difference "3" between the state pass loops SPL of the target states P2 and P3 may be determined as the delta loop DL of the target states P3. According to the condition of the state pass loops SPL, the delta loop DL of each of the target states P4 to P7 may be calculated to be "3".

The loop count "7" of the state pass loop SPL of the target state P1 is included in a SPL reference range "6" (SPL Min) to "8" (SPL Max) of the state pass loop SPL of the target state P1. Accordingly, the Loop Status of the state loop count information SLCI of the target state P1 may be set to pass. The loop count "10" of the state pass loop SPL of the target state P2 is included in a SPL reference range "9" to "11" of the state pass loop SPL of the target state P2. A value "3" of the delta loop DL of the target state P2 is included in a DL reference range "2" (Delta Min) to "4" (Delta Max) of the delta loop DL of the target state P2. Accordingly, the state loop count information SLCI of the target state P2 may be set to pass.

Likewise, a loop count "13" of the state pass loop SPL of the target state P3 is included in a SPL reference range "12" to "14" of the target state P3. A value "3" of the delta loop DL of the target state P3 is included in a DL reference range "2" to "4" of the delta loop DL of the target state P3. Accordingly, the state loop count information SLCI of the target state P3 may be set to pass. According to the above-described comparison operation, in a similar manner as target states P2 and P3, the state loop count information of the remaining target states P4 to P7 may be set to pass. In the case where the loop statuses of all the target states are set to pass, the loop status of a program cycle or a program operation may be set to pass. Afterwards, the determined loop status may be stored in the status register 125.

An example in which the state loop count information SLCI is determined on the basis of the state pass loop SPLi and the delta loop DL is described above. However, determination of pass or fail loop status should not be limited to the above-described conditions and may be variously changed in other embodiments.

FIGS. 11A, 11B, 11C and 11D illustrate block diagrams of information provided to and used by a bad block manager for bad block assignment. Referring to FIGS. 11A to 11D, the bad block manager 112 may make a request to the nonvolatile memory device 120 for the state loop count information SLCI with reference to or based on the number of P/E cycles, an operation temperature, and error bit information.

Figure 11A:
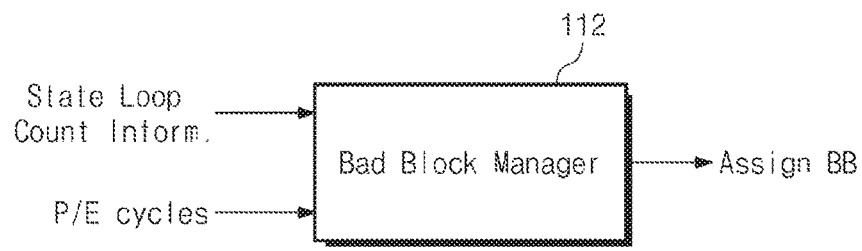
FIGS. 11A, 11B, 11C and 11D illustrate block diagrams of information provided to and used by a bad block manager for bad block assignment.

Referring to FIG. 11A, the bad block manager 112 monitors P/E cycles of memory blocks. That is, the bad block manager 112 may receive information indicative of the P/E cycles of memory blocks as shown in FIG. 11A. The bad block manager 112 may determine whether the number of P/E cycles of any one memory block exceeds a specified reference count pTh. If there is a memory block of which the number of P/E cycles exceeds the specified reference count pTh, the bad block manager 112 makes a request to the nonvolatile memory device 120 for the state loop count information SLCI of the memory block. The bad block manager 112 then assigns any memory block from among the memory blocks that exceed the specified reference count pTh as a bad block (shown as Assign BB in FIG. 11A) based on the state loop count information SLCI provided from the nonvolatile memory device 120. For example, the state loop count information SLCI may be provided as shown and described with respect to FIG. 10.

Figure 11B:
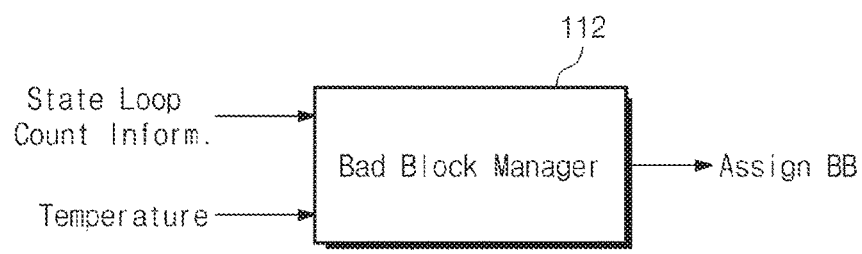

Referring to FIG. 11B, the bad block manager 112 monitors an operation temperature of the nonvolatile memory device 120. That is, the bad block manager 112 may receive information indicative of the operation temperature of the nonvolatile memory device as shown in FIG. 11B. The bad block manager 112 may determine whether the operation temperature exceeds a specified reference temperature tTH. If there is a memory block of which the operation temperature exceeds the specified reference temperature tTh, the bad block manager 112 makes a request to the nonvolatile memory device 120 for the state loop count information SLCI of memory blocks. The bad block manager 112 then assigns any memory block from among the memory blocks that exceed the specified reference temperature tTh as a bad block (shown as Assign BB in FIG. 11B) based on the state loop count information SLCI provided from the nonvolatile memory device 120.

Figure 11C:
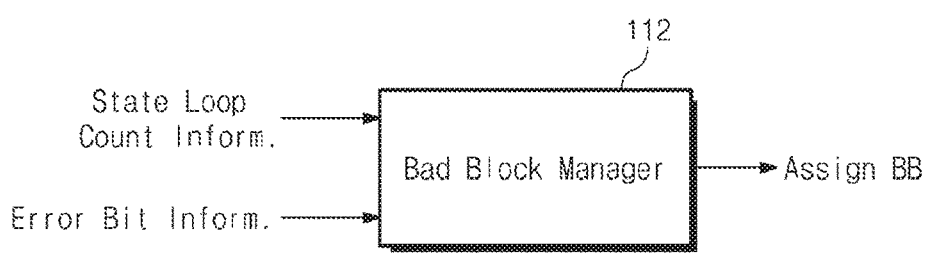

Referring to FIG. 11C, the bad block manager 112 monitors error bit information (e.g., the number of error bits) of read data. That is, the bad block manager 112 may receive information indicative of the number of error bits of read data as shown in FIG. 11C. The bad block manager 112 may determine whether the number of error bits exceeds a specified reference value eTH. If the number of error bits of the read data exceeds the specified reference value eTh, the bad block manager 112 makes a request to the nonvolatile memory device 120 for the state loop count information SLCI of memory blocks. The bad block manager 112 then assigns any memory block from among the read data having a number of error bits that exceeds the specified reference value eTh as a bad block (shown as Assign BB in FIG. 11C) based on the state loop count information SLCI provided from the nonvolatile memory device 120.

Figure 11D:
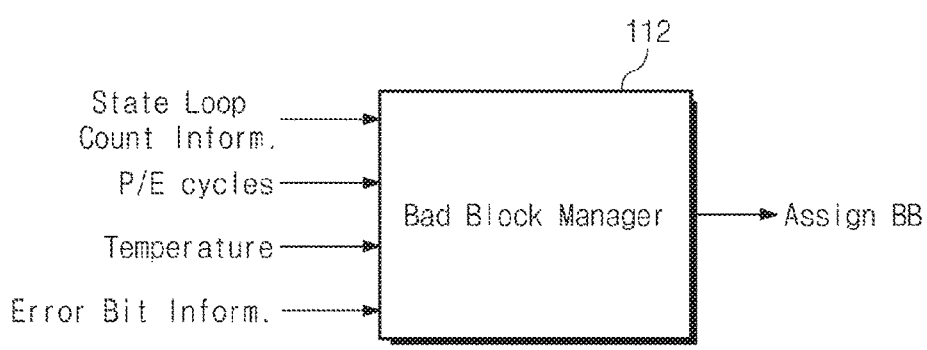

Referring to FIG. 11D, the bad block manager 112 combines the results of monitoring the number of P/E cycles, an operation temperature, and error bit information to make a request to the nonvolatile memory device 120 for the state loop count information SLCI. That is, the bad block manager 112 may receive information indicative of the P/E cycles of memory blocks, the operation temperature of the nonvolatile memory device, and the number of error bits of read data as shown in FIG. 11D. If the number of P/E cycles exceeds the specified reference count pTh, and/or the operation temperature exceeds the specified reference temperature tTh, and/or the number of error bits exceeds the specified reference value eTh (i.e., if at least one of pTh, tTh and eTh are exceeded), the bad block manager 112 makes a request to the nonvolatile memory device 120 for the state loop count information SLCI of memory blocks. The bad block manager 112 then assigns any memory block from among the memory blocks that exceeds at least one of pTh, tTh and eTh as a bad block (shown as Assign BB in FIG. 11D) based on the state loop count information SLCI from the nonvolatile memory device 120.

Information provided for bad block assignment to the bad block manager 112 is described above with respect to FIGS. 11A-11D. However, it should be understood that in other embodiments of the inventive concepts the bad block manager 112 may make a request to the nonvolatile memory device 120 for the state loop count information SLCI in response to a specific command from the host.

Figure 12:
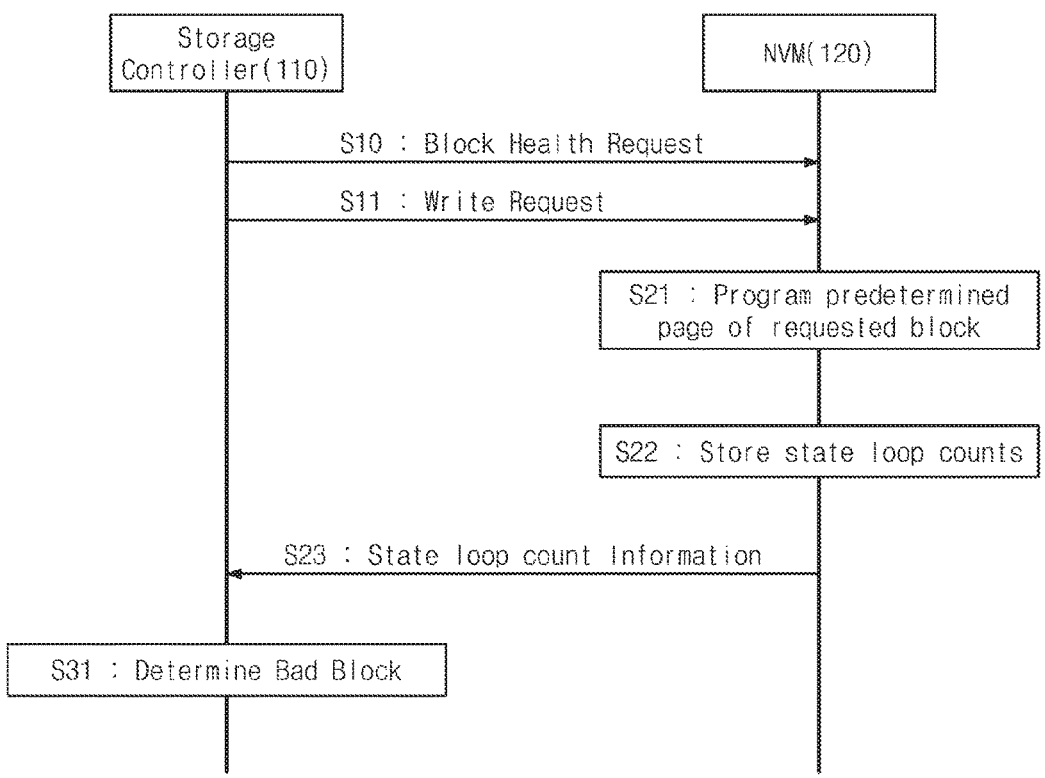
FIG. 12 illustrates a view of another example of the bad block assignment operation of the storage device according to an embodiment of the inventive concepts.

FIG. 12 illustrates a view of another example of a bad block assignment operation of a storage device according to an embodiment of the inventive concepts. Referring to FIG. 12, the storage controller 110 may monitor the state loop count information SLCI associated with specific memory cells of a memory block to perform a bad block processing operation.

In operation S10, the storage controller 110 makes a request to the nonvolatile memory device 120 for block health information of a specific memory block. The storage controller 110 may make the request using a memory block health information request command sent to the nonvolatile memory device 120. The state loop count information SLCI according to an embodiment of the inventive concept may be included in the block health information.

In operation S11, the storage controller 110 makes a write request to the nonvolatile memory device 120 to write data to memory cells of the specific memory block.

In operation S21, the nonvolatile memory device 120 writes (programs) the write-requested data in the memory cells which are connected to a specific page or a specific word line of the selected memory block, in response to the write request. The specific word line may be a word line that is adjacent to the string selection line SSL, the ground selection line GSL, or a dummy word line.

In operation S22, the nonvolatile memory device 120 generates and stores the state loop count information SLCI during the program operation of selected memory cells. For example, the nonvolatile memory device 120 may store a state pass loop (SPL) count, a delta loop (DL) count, and a loop status LS of each target state and a total program status PS. The state loop count information SLCI may for example be stored in status register 125 as shown in FIGS. 1 and 25.

In operation S23, the nonvolatile memory device 120 provides the generated state loop count information SLCI to the storage controller 110.

In operation S31, the storage controller 110 determines a health state of the selected memory block by using the state loop count information SLCI. The storage controller 110 assigns the selected memory block as a bad block depending on the health state.

Figure 13A:
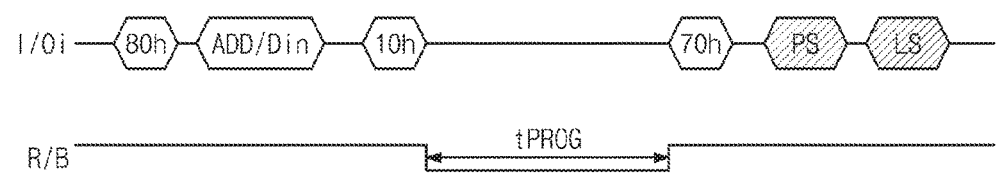
FIGS. 13A and 13B illustrate views of examples of a command sequence for transferring the state loop count information between a storage controller and a nonvolatile memory device, according to an embodiment of the inventive concepts.
Figure 13B:
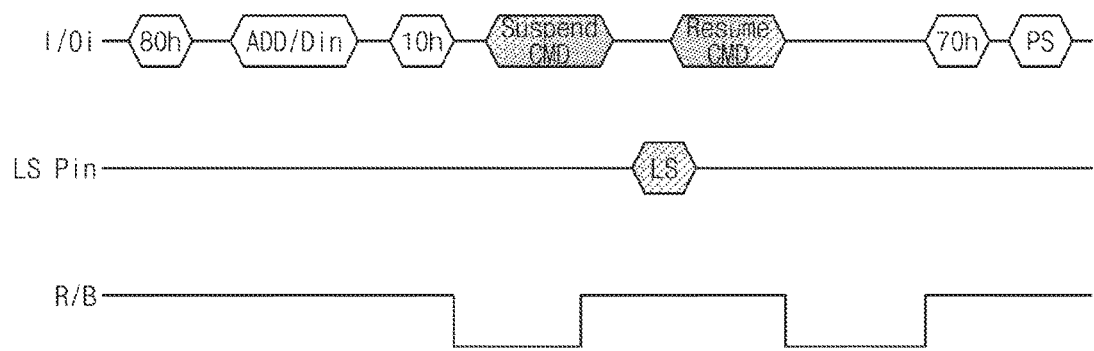

FIGS. 13A and 13B illustrate views of examples of a command sequence for transferring the state loop count information SLCI between a storage controller and a nonvolatile memory device, according to an embodiment of the inventive concepts.

Referring to FIG. 13A, the state loop count information SLCI may be requested by using a command to request an existing program status (the existing program status hereinafter referred to as "PS"). First, the storage controller 110 (refer to FIG. 1) may provide a write command, an address, and data 80 h-ADD/Din-10 h to the nonvolatile memory device 120 (refer to FIG. 1). After a confirm command 10 h is received, the nonvolatile memory device 120 may program the write data Din in a selected memory area and may make a ready/busy signal R/B transition to a low level. If programming is completed (after tPROG), the nonvolatile memory device 120 makes the ready/busy signal R/B transition to a high level. In this case, the storage controller 110 may issue a status read command 70 h to the nonvolatile memory device 120. The nonvolatile memory device 120 may output a program status PS and a loop status LS to the storage controller 110 in response to the status read command 70 h. Here, the loop status LS refers to information indicating program pass or fail of each target state. That is, the loop status LS may be included in the state loop count information SLCI.

Referring to FIG. 13B, the loop status LS may be provided by using a separate dedicated pin, not an input/output pin I/Oi. For example, in the case where suspend and resume commands are provided during a program operation, it is difficult to output the loop status LS through the input/output pin I/Oi. For this reason, the nonvolatile memory device 120 may include a separate channel for outputting the state loop count information SLCI via the dedicated pin.

The storage controller 110 may provide a write command, an address, and data 80 h-ADD/Din-10 h to the nonvolatile memory device 120. After the confirm command 10 h is received, the nonvolatile memory device 120 may program the write data Din in a selected memory area and may make the ready/busy signal R/B transition to a low level. Before programming is completed, the storage controller 110 may issue suspend and resume commands to the nonvolatile memory device 120. For example, the nonvolatile memory device 120 may output the state loop count information SLCI or the loop status LS through a separate pin immediately after the suspend command is provided. After the resume command is received, the nonvolatile memory device 120 may program the write data Din in the selected memory area and may make the ready/busy signal R/B transition to a high level again. In this case, the storage controller 110 may issue the status read command 70 h to the nonvolatile memory device 120. The nonvolatile memory device 120 may output the program status PS to the storage controller 110 in response to the status read command 70 h.

Figure 14:
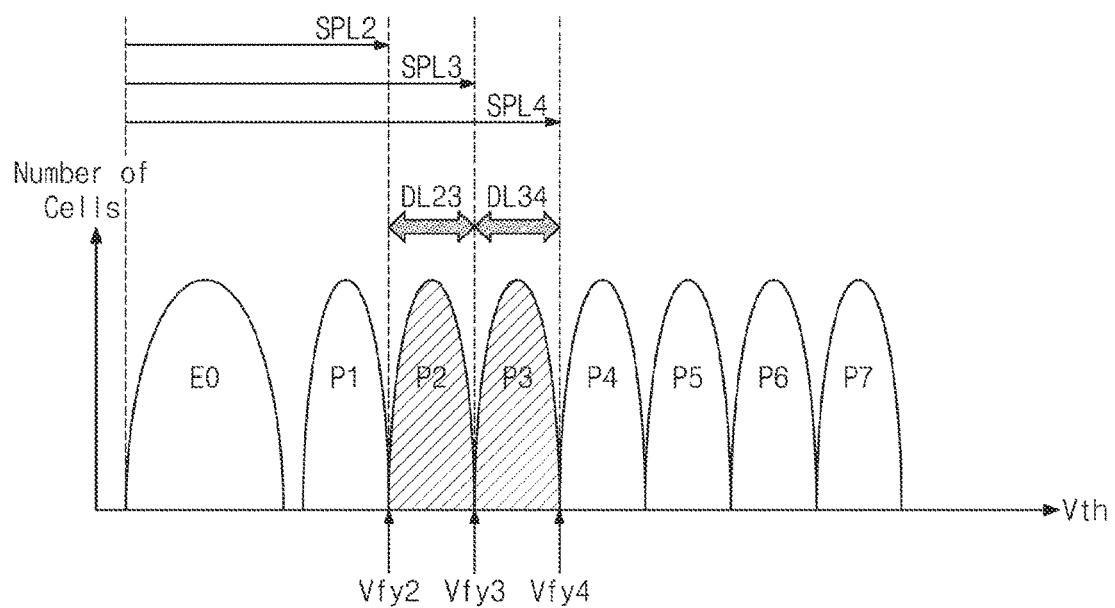
FIG. 14 illustrates a view of the state loop count information according to another embodiment of the inventive concepts.

FIG. 14 illustrates a view of the state loop count information SLCI according to another embodiment of the inventive concepts. Referring to FIG. 14, the state loop count information SLCI may include state pass loops SPL and delta loops DL of only some target states P2 and P3.

A threshold voltage of each of selected memory cells may be shifted to any one of program states P1, P2, P3, P4, P5, P6, and P7 from the erase state E0 as the program operation is executed. Whether memory cells to be programmed to the target state P2 are successfully programmed may be detected by the verification voltage Vfy2. Whether memory cells to be programmed to the target state P3 are successfully programmed may be checked by a verification voltage Vfy3. The second state pass loop SPL2 and the third state pass loop SPL3 are respectively consumed to program the memory cells to the target states P2 and P3.

However, in this embodiment only state pass loops SPL2 and SPL3 corresponding to the target states P2 and P3 may be used to determine a loop status. In addition, a delta loop corresponding to a difference between the state pass loops SPL2 and SPL3 may be decided. A delta loop DL23 between the target states P2 and P3 corresponds to a difference between the second state pass loop SPL2 and the third state pass loop SPL3. A delta loop DL34 between the target states P3 and P4 corresponds to a difference between the third state pass loop SPL3 and the fourth state pass loop SPL4.

The state pass loops SPL2 and SPL3 and the delta loops DL23 and DL34, which correspond to the target states P2 and P3 used to determine a loop status, may be decided to have values of optimum data reliability. Values of the optimum state pass loops SPL2 and SPL3 and the optimum delta loops DL23 and DL34 may be obtained through testing or simulation that is made in consideration of various characteristics of the nonvolatile memory device 120.

Figure 15:
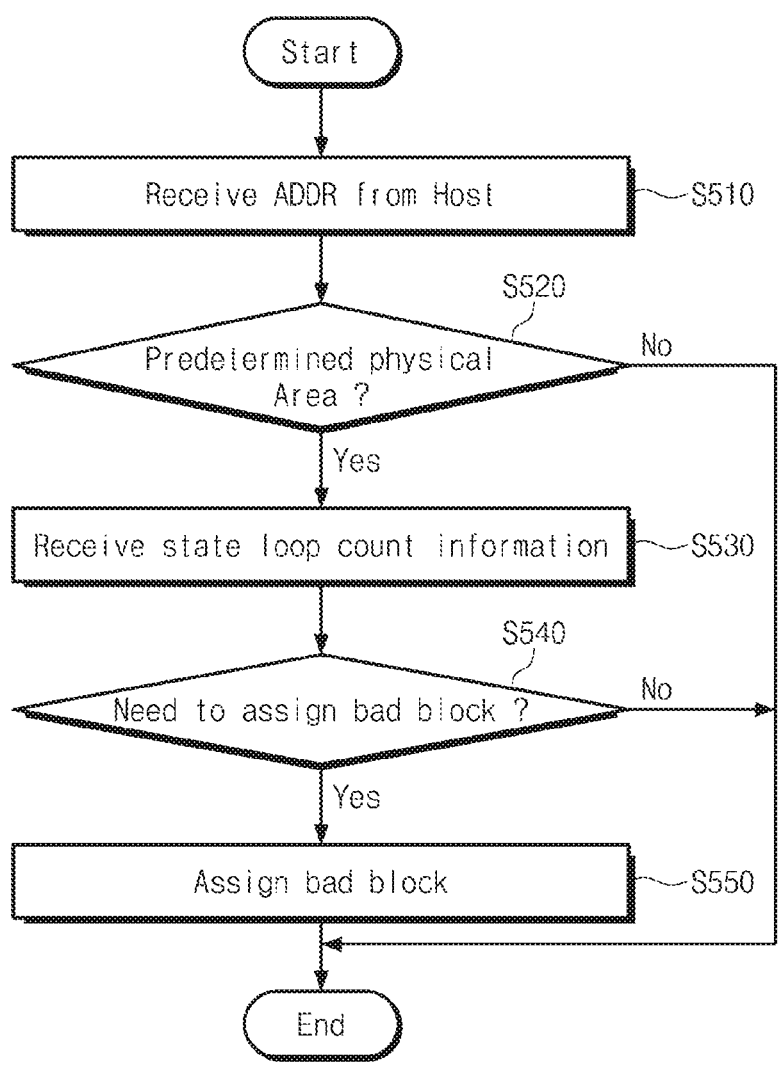
FIG. 15 illustrates a flowchart of another example of the memory management operation of the storage device according to an embodiment of the inventive concepts.

FIG. 15 illustrates a flowchart of another example of a memory management operation of a storage device according to an embodiment of the inventive concepts. Referring to FIG. 15, the storage device 100 (refer to FIG. 1) may perform a bad block processing operation by using the state loop count information SLCI associated with a specific area of the nonvolatile memory device 120.

In operation S510, the storage device 100 is provided with a write request and an address ADDR from the host.

In operation S520, the storage controller 110 determines whether the address ADDR from the host corresponds to a physical area of a target of interest. The physical area of the target of interest may be decided according to a characteristic of the nonvolatile memory device 120. If the address ADDR from the host corresponds to the physical area of the target of interest (Yes) in operation S520, the procedure proceeds to operation S530. In contrast, if the address ADDR from the host is not associated with the physical area of the target of interest (No) in operation S520, the procedure ends.

In operation S530, the storage controller 110 makes a request to the nonvolatile memory device 120 for the state loop count information SLCI. The storage controller 110 may make a request to the nonvolatile memory device 120 for the state loop count information SLCI of the memory area of the target of interest. In response to the request, the nonvolatile memory device 120 may output the state loop count information SLCI stored in the status register 125 to the storage controller 110. The storage controller 110 receives the state loop count information SLCI from the nonvolatile memory device 120.

In operation S540, the storage controller 110 determines whether to assign the memory block including the physical area of the target of interest as a bad block by using the state loop count information SLCI. For example, if it is determined that loop counts of some of the target states of memory cells corresponding to the physical area of the target of interest are out of the reference range and that the memory block including the physical area of the target of interest needs to be assigned as a bad block (Yes) in operation S540, the procedure proceeds to operation S550. If it is determined that loop counts of the target states of memory cells corresponding to the physical area of the target of interest are not out of the reference range and that the memory block does not need to be assigned as a bad block (No) in operation S540, the run time bad block (RTBB) processing operation ends.

In operation S550, the storage controller 110 assigns the memory block as a bad block. Afterwards, the memory block assigned as the bad block may not be used any more to store data. Accordingly, the occurrence of the run time bad block RTBB may be prevented in advance, and the integrity of data of the storage device 100 may be improved.

Figure 16:
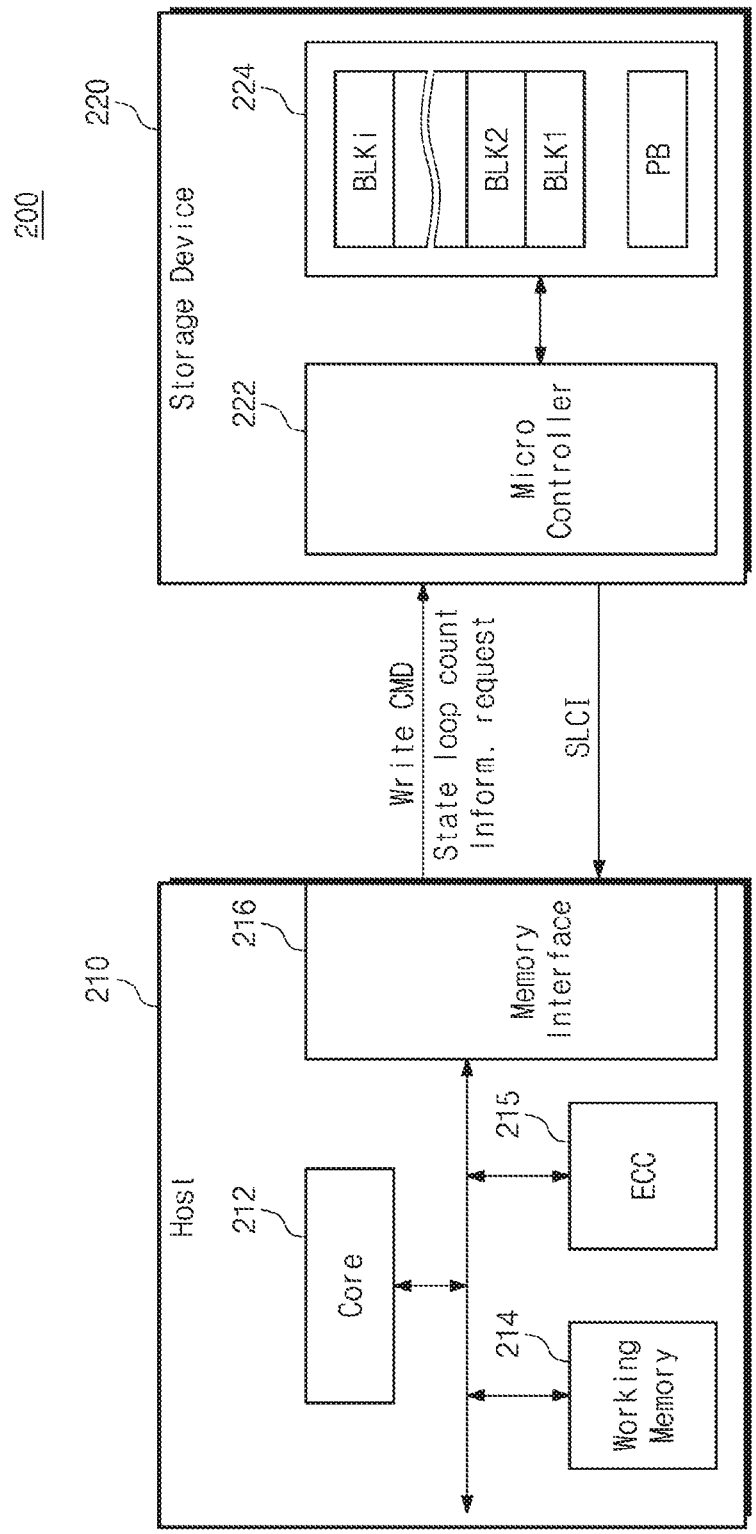
FIG. 16 illustrates a block diagram of a user system according to an embodiment of the inventive concepts.

FIG. 16 illustrates a block diagram of a user system according to an embodiment of the inventive concepts. Referring to FIG. 16, a user system 200 includes a host 210 and a storage device 220. The host 210 includes a core 212, a working memory 214, an ECC unit 215, and a memory interface 216. The storage device 220 includes a microcontroller 222 and a nonvolatile memory device 224. Here, the storage device 220 may be implemented with a perfect page new (PPN) memory device.

The core 212 of the host 210 may execute various application programs loaded on the working memory 214 or may process data loaded on the working memory 414. Software such as an operating system and an application program may be loaded on the working memory 214. In particular, software modules that perform a bad block processing operation by using the state loop count information SLCI according to embodiments of the inventive concepts may be loaded on the operating system loaded in the working memory 214.

The memory interface 216 may convert a memory address access-requested by the core 212 into a physical address. The memory interface 216 may perform, for example, a function of a flash translation layer (FTL).

The micro-controller 222 may provide the nonvolatile memory device 224 with a request for the state loop count information SLCI, an address ADDR, control signals CTRLs, commands such as a Write Command (CMD) and data from the host 210. The storage device 220 may generate and store the state loop count information SLCI during a program operation. The storage device 220 may provide the host 210 with the stored state loop count information SLCI in response to the request from the host 210.

According to embodiments of the inventive concepts, there may be provided a storage device that determines a program failure of a specific word line, which occurs due to an increase in the number of stacked layers of a three-dimensional nonvolatile memory device, in advance such that a memory block corresponding to the specific word line is assigned as a bad block. Accordingly, according to embodiments of the inventive concepts, since a selected memory block is assigned as a bad block before an uncorrectable error occurs, a high-capacity and high-reliability storage device may be provided.

While the inventive concepts have been described with reference to the various disclosed embodiments, it should be apparent to those skilled in the art that various changes and modifications may be made without departing from the spirit and scope of the inventive concepts. Therefore, it should be understood that the above embodiments are not limiting, but illustrative.

What is claimed is:

1. A storage device comprising:
a nonvolatile memory device configured to detect loop counts of state pass loops of at least one target state of a plurality of target states, and generate state loop count information (SLCI) indicative of whether a program operation is successful based on the detected loop counts of the state pass loops, during a program operation of selected memory cells; and
a storage controller configured to make a request to the nonvolatile memory device for the state loop count information in response to detection of an operation condition or an external command, and assign a memory block in which the selected memory cells are included as a bad block based on the state loop count information from the nonvolatile memory device.

2. The storage device of claim 1, wherein the operation condition includes a condition that a number of error bits included in data read from the selected memory cells exceeds a reference value.

3. The storage device of claim 1, wherein the operation condition includes a condition that an operation temperature of the nonvolatile memory device exceeds a reference temperature.

4. The storage device of claim 1, wherein the operation condition includes a condition that a number of program/erase (P/E) cycles of the memory block exceeds a reference count.

5. The storage device of claim 1, wherein the storage controller comprises a bad block manager configured to map the memory block as the bad block based on the operation condition and the state loop count information.

6. The storage device of claim 1, wherein the nonvolatile memory device comprises:
a program loop count circuit configured to detect the loop counts of the state pass loops of the plurality of target states; and
a status register configured to store the state loop count information, which indicates a pass state or fail state of each of the plurality of target states, based on the detected loop counts of the state pass loops.

7. The storage device of claim 6, wherein the nonvolatile memory device further comprises a dedicated pin configured to output the state loop count information.

8. The storage device of claim 1, wherein the storage controller is configured to determine a fail state of the program operation of some target states of the plurality of target states based on the state loop count information, and assign the memory block as the bad block based on a result of determining the fail state.

9. The storage device of claim 1, wherein the storage controller is configured to make the request to the nonvolatile memory device for the state loop count information by using a memory block health information request command.

10. The storage device of claim 1, wherein the storage controller is configured to make the request to the nonvolatile memory device for the state loop count information through a status read command.

11. A bad block assignment method of a storage device, the storage device comprising a nonvolatile memory device and a storage controller, the method comprising:
monitoring, by the storage controller, an operation condition for performing a run time bad block processing operation;
making, by the storage controller, a request to the nonvolatile memory device for state loop count information of a selected memory block of the nonvolatile memory device based on a result of the monitoring; and
assigning, by the storage controller, the selected memory block as a bad block with reference to the state loop count information from the nonvolatile memory device,
wherein the state loop count information is information indicative of a pass state or a fail state of a program operation, and the nonvolatile memory device determines the state loop count information based on a result of detecting loop counts of state pass loops of each of a plurality of target states of memory cells of the selected memory block upon programming the selected memory block.

12. The method of claim 11, wherein the operation condition includes a condition that a specific command is received from a host.

13. The method of claim 11, wherein the operation condition includes at least one of a condition that a number of error bits detected from data stored in the selected memory block exceeds a reference value, a condition that an operation temperature of the nonvolatile memory device exceeds a reference temperature, and a condition that a number of P/E cycles of the selected memory block exceeds a reference count.

14. The method of claim 11, wherein the state loop count information is generated from the memory cells connected to a specific word line of the selected memory block or from a specific page belonging to the specific word line.

15. The method of claim 14, wherein the specific word line includes a word line that is adjacent to a ground selection line, a string selection line, or a dummy word line of the selected memory block.

16. A storage device comprising:
a nonvolatile memory device configured to store data in a plurality of memory blocks; and
a storage controller configured to detect an operation condition of the nonvolatile memory device, request state loop count information from the nonvolatile memory device based on the detected operation condition, receive the state loop count information from the nonvolatile memory device, and assign a selected memory block from among the plurality of memory blocks as a bad block based on the state loop count information,
wherein the state loop count information comprises loop counts of state pass loops of a plurality of target states of memory cells within the selected memory block.

17. The storage device of claim 16, wherein the operation condition includes a condition that a number of error bits included in data read from the memory cells exceeds a reference value.

18. The storage device of claim 16, wherein the operation condition includes a condition that an operation temperature of the nonvolatile memory device exceeds a reference temperature.

19. The storage device of claim 16, wherein the operation condition includes a condition that a number of program/erase (P/E) cycles of the selected memory block exceeds a reference count.

20. The storage device of claim 16, wherein the storage controller is configured to assign the selected memory block as the bad block based on whether the loop counts of the state pass loops of the plurality of target states are within state pass loop reference ranges.

* * * * *